(12) United States Patent
Suzuki et al.

(10) Patent No.: US 12,378,111 B2
(45) Date of Patent: *Aug. 5, 2025

(54) METHOD OF MANUFACTURING MIRROR DEVICE

(71) Applicant: HAMAMATSU PHOTONICS K.K., Hamamatsu (JP)

(72) Inventors: Daiki Suzuki, Hamamatsu (JP); Takahiro Matsumoto, Hamamatsu (JP); Tomoyuki Ide, Hamamatsu (JP); Mikito Takahashi, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 304 days.

This patent is subject to a terminal disclaimer.

(21) Appl. No.: 17/766,780

(22) PCT Filed: Aug. 24, 2020

(86) PCT No.: PCT/JP2020/031794
§ 371 (c)(1),
(2) Date: Apr. 6, 2022

(87) PCT Pub. No.: WO2021/079607
PCT Pub. Date: Apr. 29, 2021

(65) Prior Publication Data
US 2024/0059555 A1  Feb. 22, 2024

(30) Foreign Application Priority Data
Oct. 23, 2019  (JP) ................................. 2019-193001

(51) Int. Cl.
*B81C 1/00* (2006.01)
*G02B 26/08* (2006.01)

(52) U.S. Cl.
CPC ...... *B81C 1/00825* (2013.01); *G02B 26/0833* (2013.01); *B81C 2201/0132* (2013.01); *B81C 2201/0146* (2013.01)

(58) Field of Classification Search
None
See application file for complete search history.

(56) References Cited

U.S. PATENT DOCUMENTS

| | | | |
|---|---|---|---|
| 6,542,282 B2 | 4/2003 | Smith et al. | |
| 6,774,445 B2 | 8/2004 | Mutoh et al. | |
| (Continued) | | | |

FOREIGN PATENT DOCUMENTS

| | | |
|---|---|---|
| DE | 102017206252 A1 | 10/2018 |
| JP | 2002-258205 A | 9/2002 |
| (Continued) | | |

OTHER PUBLICATIONS

International Preliminary Report on Patentability mailed May 5, 2022 for PCT/JP2020/031794.

*Primary Examiner* — Stephanie P Duclair
(74) *Attorney, Agent, or Firm* — Faegre Drinker Biddle & Reath LLP

(57) ABSTRACT

A method for manufacturing a mirror device, the method includes a first step of preparing a wafer having a support layer and a device layer; a second step of forming a slit in the wafer such that the movable portion becomes movable with respect to the base portion by removing a part of each of the support layer and the device layer from the wafer by etching and forming a plurality of parts each corresponding to the structure in the wafer, after the first step; a third step of performing wet cleaning for cleaning the wafer using a cleaning liquid after the second step; and a fourth step of cutting out each of the plurality of parts from the wafer after the third step. In the second step, a circulation hole pen- (Continued)

etrating the wafer is formed at a part other than the slit in the wafer by the etching.

19 Claims, 22 Drawing Sheets

(56) References Cited

U.S. PATENT DOCUMENTS

| | | | |
|---|---|---|---|
| 7,428,092 B2 | 9/2008 | Lee et al. | |
| 10,103,613 B2 | 10/2018 | Sadaharu et al. | |
| 2005/0074919 A1* | 4/2005 | Patel | B81B 7/0077 |
| | | | 438/107 |
| 2010/0018635 A1 | 1/2010 | Kouma et al. | |
| 2013/0043214 A1 | 2/2013 | Forrest et al. | |
| 2013/0083379 A1* | 4/2013 | Tanaka | G02B 26/0858 |
| | | | 359/200.8 |

FOREIGN PATENT DOCUMENTS

| | | | |
|---|---|---|---|
| JP | 2002-267996 A | | 9/2002 |
| JP | 2002258205 | * | 9/2002 |
| JP | 2002267996 | * | 9/2002 |
| JP | 2002-296517 A | | 10/2002 |
| JP | 2002296517 | * | 10/2002 |
| JP | 2004-066379 A | | 3/2004 |
| JP | 2004066379 | * | 3/2004 |
| JP | 2006-147995 A | | 6/2006 |
| JP | 2006-334697 A | | 12/2006 |
| JP | 2008-173719 A | | 7/2008 |
| JP | 2009-080379 A | | 4/2009 |
| JP | 2012-063413 A | | 3/2012 |
| JP | 2013-080068 A | | 5/2013 |
| JP | 2013-092744 A | | 5/2013 |
| JP | 2014-523848 A | | 9/2014 |
| JP | 2019-101234 A | | 6/2019 |
| WO | WO-2013/095712 A2 | | 6/2013 |
| WO | WO-2013/115967 A1 | | 8/2013 |

* cited by examiner

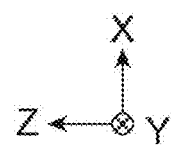
Fig.6
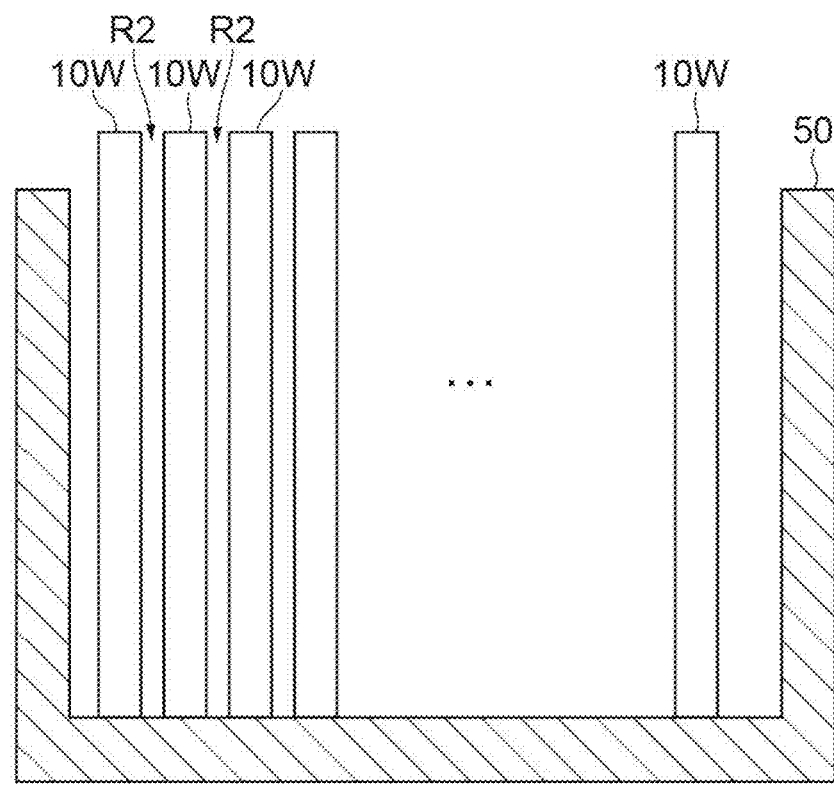

METHOD OF MANUFACTURING MIRROR DEVICE

TECHNICAL FIELD

The present disclosure relates to a method for manufacturing a mirror device.

BACKGROUND ART

Regarding a micro-electro mechanical system (MEMS) device constituted of a silicon-on-insulator (SOI) substrate, a mirror device provided with a structure including a base portion and a movable portion supported on the base portion, and a mirror layer provided on the movable portion is known. Regarding a method for manufacturing such a mirror device, the wafer may be cleaned using a cleaning liquid after the movable portion is released such that the movable portion becomes movable with respect to the base portion (for example, refer to Patent Literature 1).

CITATION LIST

Patent Literature

[Patent Literature 1] Japanese Unexamined Patent Publication No. 2006-334697

SUMMARY OF INVENTION

Technical Problem

In the method for manufacturing a mirror device described above, a wafer having the released movable portion is cleaned using a cleaning liquid. Therefore, there is concern that a plurality of movable portions may be damaged due to a load of the cleaning liquid. In order to curb occurrence of such damage, it is conceivable to weaken the intensity of cleaning using a cleaning liquid. However, in that case, there is concern that a foreign substance may remain in the wafer.

An object of the present disclosure is to provide a method for manufacturing a mirror device, in which occurrence of damage to a mirror device and a foreign substance remaining can be curbed.

Solution to Problem

A method according to an aspect of the present disclosure is a method for manufacturing a mirror device includes a structure including a base portion and a movable portion supported on the base portion, and a mirror layer provided to the movable portion. The method includes a first step of preparing a wafer having a support layer and a device layer; a second step of forming a slit in the wafer such that the movable portion becomes movable with respect to the base portion by removing a part of each of the support layer and the device layer from the wafer by etching and forming a plurality of parts each corresponding to the structure in the wafer, after the first step; a third step of performing wet cleaning for cleaning the wafer using a cleaning liquid after the second step; and a fourth step of cutting out each of the plurality of parts from the wafer after the third step. In the second step, a circulation hole penetrating the wafer is formed at a part other than the slit in the wafer by the etching.

In this method for manufacturing a mirror device, in the third step, the wafer in a state in which the movable portion becomes movable with respect to the base portion (which will hereinafter be referred to as "the movable portion is released") is cleaned with a cleaning liquid. Accordingly, a foreign substance can be removed from the wafer having a plurality of released movable portions. Here, in the second step, the circulation hole penetrating the wafer is formed at a part other than the slit in the wafer by the etching. For this reason, during the wet cleaning in the third step, while the cleaning liquid is circulated via the circulation hole, the wafer having a plurality of released movable portions can be cleaned. Therefore, a load received by the plurality of movable portions due to the cleaning liquid can be reduced, and occurrence of damage to the plurality of movable portions can be curbed. Thus, according to this method for manufacturing a mirror device, occurrence of damage to the mirror device and a foreign substance remaining can be curbed.

In the method for manufacturing a mirror device according to the aspect of the present disclosure, in the second step, the mirror layer may be formed to the wafer at a part corresponding to the movable portion. Accordingly, a foreign substance adhered to the mirror layer can be removed through the wet cleaning in the third step.

The method for manufacturing a mirror device according to the aspect of the present disclosure may further include a fifth step of forming a straightening layer on a first front surface where the mirror layer is formed and/or a second front surface on a side opposite to the first front surface of surfaces of the wafer between the third step and the fourth step. Accordingly, covering of a foreign substance by the straightening layer can be curbed.

In the method for manufacturing a mirror device according to the aspect of the present disclosure, in the second step, protective film removal for removing a protective film may be performed after a part of the support layer is removed from the wafer, and the plurality of parts may be brought to completion after the protective film removal. Accordingly, when a part of the support layer is removed from the wafer, a foreign substance adhered to the wafer can be removed by the protective film removal in the second step. Moreover, when the protective film is removed, a foreign substance or the like remaining in the wafer can be removed by the wet cleaning in the third step.

In the method for manufacturing a mirror device according to the aspect of the present disclosure, in the protective film removal, the protective film may be removed by a wet process. When the protective film is removed by the wet process, for example, stain or the like may occur due to unevenness of the device layer. In this case, the stain or the like can be removed by the wet cleaning in the third step.

In the method for manufacturing a mirror device according to the aspect of the present disclosure, in the second step, patterning member removal for removing a patterning member may be performed, and the plurality of parts may be brought to completion after the patterning member removal. Accordingly, since the patterning member is removed before the plurality of movable portions are released, occurrence of damage to the mirror device due to the patterning member removal can be curbed.

In the method for manufacturing a mirror device according to the aspect of the present disclosure, in the patterning member removal, the patterning member may be removed by a wet process. Accordingly, since the patterning member is removed before the plurality of movable portions are released, even if the patterning member is removed by the wet process, occurrence of damage to the mirror device can be curbed.

In the method for manufacturing a mirror device according to the aspect of the present disclosure, in the second step, a plurality of the circulation holes may be formed at a part corresponding to the movable portion. Accordingly, during the wet cleaning in the third step, a turbulent flow of the cleaning liquid is likely to be generated in the vicinity of the movable portion. Therefore, a foreign substance can be reliably removed from a part corresponding to the movable portion.

In the method for manufacturing a mirror device according to the aspect of the present disclosure, the circulation hole may be formed at a part corresponding to the base portion. Accordingly, during the wet cleaning in the third step, the cleaning liquid can be circulated via the circulation hole formed at a part corresponding to the base portion. Therefore, a load received by the wafer due to the cleaning liquid can be reduced, and occurrence of damage to the mirror device can be curbed.

In the method for manufacturing a mirror device according to the aspect of the present disclosure, in the second step, the slit may be formed such that the movable portion is supported on the base portion by a coupling portion, and the circulation hole may be formed at a part corresponding to the coupling portion. Accordingly, during the wet cleaning in the third step, a turbulent flow of the cleaning liquid is likely to be generated in the vicinity of the coupling portion. Therefore, while the intensity of the coupling portion is maintained, a foreign substance can be reliably removed from a part corresponding to the coupling portion.

In the method for manufacturing a mirror device according to the aspect of the present disclosure, in the second step, the circulation hole may be formed such that curved portion is included in at least a part. Accordingly, during the wet cleaning in the third step, a load due to the cleaning liquid received by the curved portion of the circulation hole becomes small. Therefore, occurrence of damage to the wafer can be curbed.

In the method for manufacturing a mirror device according to the aspect of the present disclosure, in the second step, the circulation hole may be formed such that width of the circulation hole vary in a direction perpendicular to the thickness direction when viewed in a thickness direction of the wafer. Accordingly, during the wet cleaning in the third step, a turbulent flow of the cleaning liquid is likely to be generated. Therefore, a foreign substance can be reliably removed from the wafer.

In the method for manufacturing a mirror device according to the aspect of the present disclosure, in the second step, the circulation hole may be formed such that edge of the circulation hole on one side and edge on the other side opposite to the edge on the one side exhibit different shapes when viewed in the thickness direction of the wafer. Accordingly, larger circulation hole is formed so that a larger amount of cleaning liquid can be circulated via the circulation hole during the wet cleaning in the third step. For this reason, a foreign substance can be reliably removed from the wafer.

In the method for manufacturing a mirror device according to the aspect of the present disclosure, in the second step, the circulation hole may be formed such that connection portion straddling the circulation hole are formed. Accordingly, during the wet cleaning in the third step, the wafer is reinforced by the connection portions. Therefore, occurrence of damage to the wafer can be curbed.

In the method for manufacturing a mirror device according to the aspect of the present disclosure, in the second step, the circulation hole may be formed such that the circulation hole communicate with the slit. Accordingly, during the wet cleaning in the third step, a larger amount of cleaning liquid can be circulated via the circulation holes.

In the method for manufacturing a mirror device according to the aspect of the present disclosure, in the second step, the circulation hole may be formed at a part corresponding to the movable portion such that the circulation hole include a first circulation region and a second circulation region adjacent to each other in a direction perpendicular to the thickness direction when viewed in the thickness direction of the wafer. Accordingly, during the wet cleaning in the third step, a turbulent flow of the cleaning liquid is likely to be generated at a place where the first circulation region and the second circulation region are adjacent to each other. Therefore, a foreign substance can be reliably removed from the wafer.

In the method for manufacturing a mirror device according to the aspect of the present disclosure, in the second step, the circulation hole may be formed such that the connection portion straddling the first circulation region is formed in a direction in which the first circulation region and the second circulation region are arranged when viewed in the thickness direction. Accordingly, during the wet cleaning in the third step, the wafer is reinforced by the connection portion. Therefore, occurrence of damage to the wafer can be curbed. In addition, during the wet cleaning in the third step, the cleaning liquid can be circulated via the second circulation region. Therefore, a load received by the connection portion due to the cleaning liquid can be reduced, and occurrence of damage to the connection portions can be curbed.

In the method for manufacturing a mirror device according to the aspect of the present disclosure, in the second step, the circulation hole may be formed such that the second circulation region includes a part where a width of the second circulation region in a direction perpendicular to the thickness direction is smaller than a width of the first circulation region in a direction perpendicular to the thickness direction when viewed in the thickness direction. Accordingly, the width of the first circulation region and the width of the second circulation region differ from each other. Therefore, a turbulent flow of the cleaning liquid is likely to be generated during the wet cleaning in the third step. For this reason, a foreign substance can be reliably removed from the wafer.

In the method for manufacturing a mirror device according to the aspect of the present disclosure, in the second step, the slit may be formed such that the movable portion is supported on the base portion by the coupling portion, and the second circulation region may be formed such that the second circulation region is adjacent to the coupling portion in a direction in which the first circulation region and the second circulation region are arranged when viewed in the thickness direction. Accordingly, during the wet cleaning in the third step, the cleaning liquid can be circulated via the second circulation region. Therefore, a load received by the coupling portion due to the cleaning liquid can be reduced, and occurrence of damage to the coupling portion can be curbed.

Advantageous Effects of Invention

According to the present disclosure, it is possible to provide the method for manufacturing a mirror device, in which occurrence of damage to the mirror device and a foreign substance remaining can be curbed.

BRIEF DESCRIPTION OF DRAWINGS

FIG. 6 is a view of a constitution for describing patterning member removal and protective film removal in the method for manufacturing the mirror device illustrated in FIG. 1.

DESCRIPTION OF EMBODIMENTS

Hereinafter, embodiments of the present disclosure will be described in detail with reference to the drawings. In each of the diagrams, the same reference signs are applied to parts which are the same or corresponding, and duplicate parts will be omitted.

First Embodiment

Figure 1:
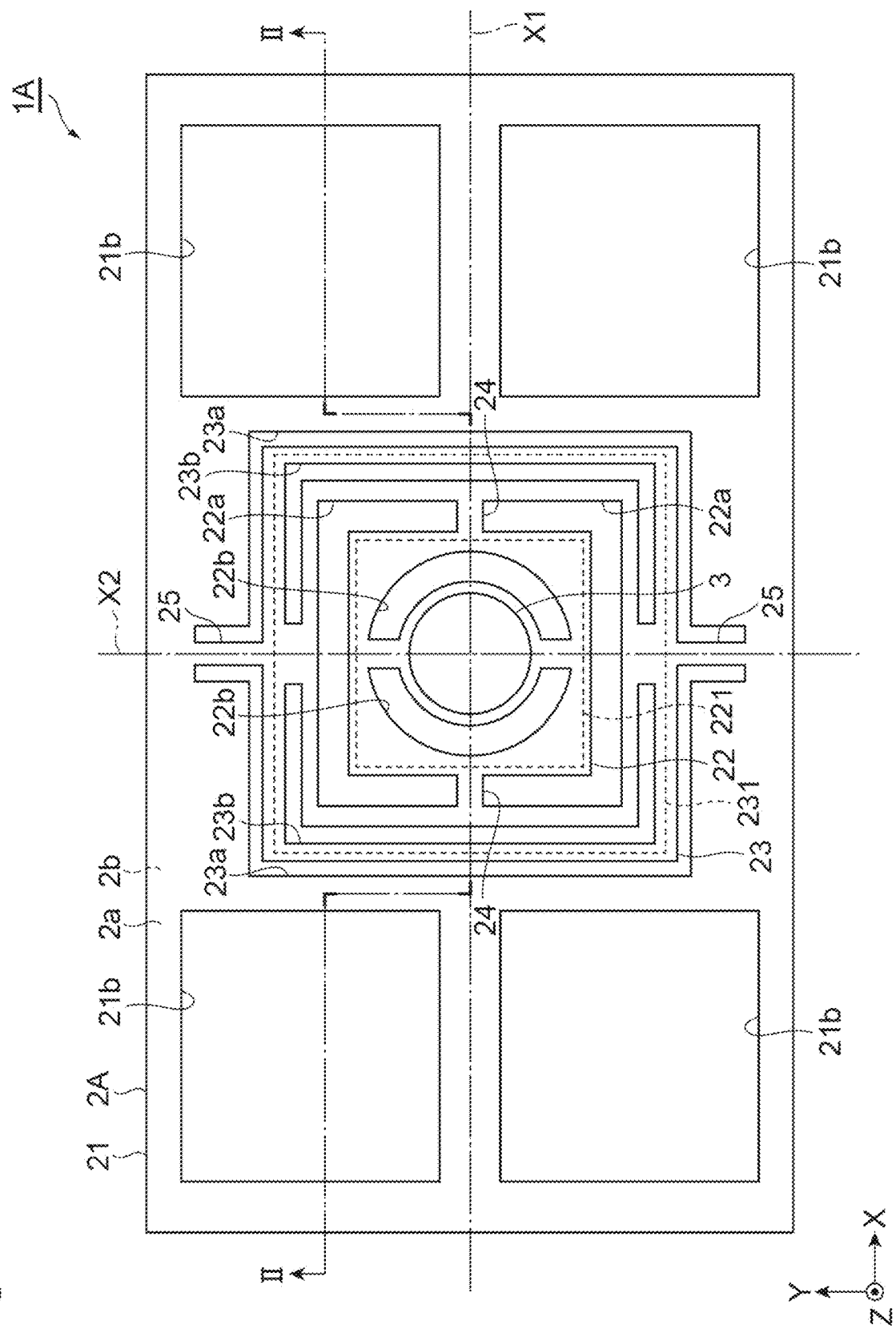
FIG. 1 is a plan view of a mirror device of a first embodiment.
Figure 2:
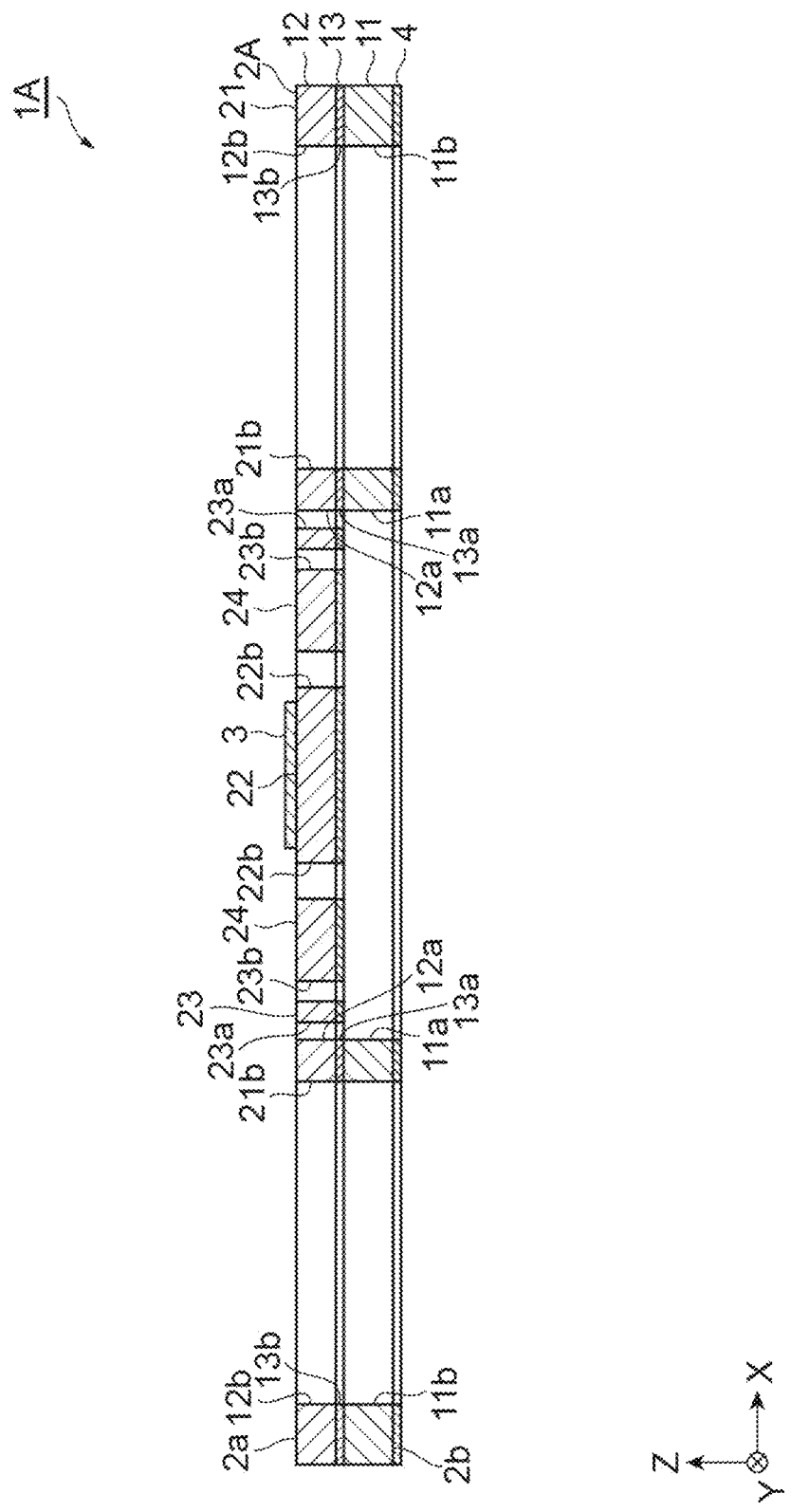
FIG. 2 is a cross-sectional view of the mirror device along line II-II illustrated in FIG. 1.

As illustrated in FIGS. 1 and 2, a mirror device 1A of a first embodiment includes a structure 2A, a mirror layer 3, and a straightening layer 4. For example, the mirror device 1A exhibits a line-symmetrical shape about each of a first axis X1 in an X axis direction and a second axis X2 in a Y axis direction. The mirror device 1A may exhibit a point-symmetrical shape about an intersection between the first axis X1 and the second axis X2. The mirror device 1A may exhibit a non-symmetrical shape. The mirror device 1A is a MEMS device and, for example, is used in an optical switch for optical communication, an optical scanner, or the like.

For example, the structure 2A is constituted of an SOI substrate. The structure 2A has a support layer 11, a device layer 12, and an intermediate layer 13. The support layer 11 is a first silicon layer. The device layer 12 is a second silicon layer. The intermediate layer 13 is an insulation layer disposed between the support layer 11 and the device layer 12. As an example, the thickness of the support layer 11 is approximately 100 µm to 700 µm, the thickness of the device layer 12 is approximately 20 µm to 200 µm, and the thickness of the intermediate layer 13 is approximately 50 nm to 3,000 nm.

For example, the structure 2A exhibits a rectangular plate shape. The structure 2A has a first front surface 2a and a second front surface 2b. The first front surface 2a is a surface on a side opposite to the intermediate layer 13 in the device layer 12. The second front surface 2b is a surface on a side opposite to the first front surface 2a in the structure 2A. The second front surface 2b includes a surface on a side opposite to the intermediate layer 13 in the support layer 11 and a surface on a side opposite to the first front surface 2a in the device layer 12.

The structure 2A is integrally constituted of a base portion 21, a first movable portion 22, a second movable portion 23, a pair of first coupling portions 24, and a pair of second coupling portions 25. The base portion 21 is constituted of a part of the support layer 11, a part of the device layer 12, and a part of the intermediate layer 13. The base portion 21 exhibits a rectangular ring shape, for example, when viewed in a Z axis direction (a thickness direction of the structure 2A). The base portion 21 has a size of approximately 10 mm×15 mm, for example, when viewed in the Z axis direction.

The first movable portion 22, the second movable portion 23, the first coupling portions 24, and the second coupling portions 25 are constituted of a part of the device layer 12. Each of the first movable portions 22 and the second movable portions 23 is supported on the base portion 21 by the first coupling portions 24 and the second coupling portions 25. Specifically, the first movable portion 22 and the second movable portion 23 are disposed on the inward side of the base portion 21 when viewed in the Z axis direction. More specifically, the second movable portion 23 is disposed on the inward side of the base portion 21 via a second slit 23a penetrating the structure 2A when viewed in the Z axis direction. The second movable portion 23 exhibits a rectangular ring shape, for example, when viewed in the Z axis direction. The second slit 23a extends along an outer edge of the second movable portion 23 when viewed in the Z axis direction. In the second slit 23a, each of an end surface 11a of the support layer 11 in the base portion 21, an end surface 12a of the device layer 12 in the base portion 21, and an end surface 13a of the intermediate layer 13 in the base portion 21 is exposed. The second slit 23a is formed to allow the second movable portion 23 to be movable with respect to the base portion 21. In the present embodiment, the second slit 23a has a minimum necessary width for allowing the second movable portion 23 to be movable with respect to the base portion 21.

The second coupling portions 25 are respectively disposed on both sides of the second movable portion 23 in the Y axis direction when viewed in the Z axis direction. For example, each of the second coupling portions 25 linearly extends in the Y axis direction. Each of the second coupling portions 25 is coupled to the base portion 21 and the second movable portion 23 such that the second movable portion 23 is movable with respect to the base portion 21. Specifically, each of the second coupling portions 25 couples the second movable portion 23 and the base portion 21 to each other on the second axis X2 such that the second movable portion 23 can swing around the second axis X2. The second slit 23a includes parts extending in the Y axis direction on both sides of each of the second coupling portions 25 in the X axis direction. Namely, each of the second coupling portions 25 is disposed on the inward side of the base portion 21 via the second slit 23a.

When viewed in the Z axis direction, the first movable portion 22 is disposed on the inward side of the second movable portion 23 via a first slit 22a penetrating the structure 2A. The first movable portion 22 exhibits a rectangular shape, for example, when viewed in the Z axis direction. The first slit 22a extends along an outer edge of the first movable portion 22 when viewed in the Z axis direction. The first slit 22a is formed to allow the first movable portion 22 to be movable with respect to the base portion 21. In the present embodiment, the first slit 22a has a minimum necessary width for allowing the first movable portion 22 to be movable with respect to the base portion 21.

The first coupling portions 24 are respectively disposed on both sides of the first movable portion 22 in the X axis direction when viewed in the Z axis direction. For example, each of the first coupling portions 24 linearly extends in the X axis direction. Each of the first coupling portions 24 is coupled to the second movable portion 23 and the first movable portion 22 such that the first movable portion 22 is movable with respect to the base portion 21. Specifically, each of the first coupling portions 24 couples the first movable portion 22 and the second movable portion 23 to each other on the first axis X1 such that the first movable portion 22 can swing around the first axis X1 in the X axis direction.

In the structure 2A, a plurality of circulation holes 21b, 22b, and 23b penetrating the structure 2A are formed. The plurality of circulation holes 21b, 22b, and 23b are formed at parts other than the first slit 22a and the second slit 23a in the structure 2A. Specifically, for example, four circulation holes 21b are formed in the base portion 21. The circulation holes 21b are respectively positioned at corner portions of the base portion 21 when viewed in the Z axis direction. The four circulation holes 21b are line-symmetrical with each other about the first axis X1 and the second axis X2. Each of the circulation holes 21b exhibits a rectangular shape, for example, when viewed in the Z axis direction. Each of the circulation holes 21b penetrates the base portion 21. Through each of the circulation holes 21b, each of an end surface 11b of the support layer 11, an end surface 12b of the device layer 12, and an end surface 13b of the intermediate layer 13 is exposed. The circulation hole 21b is larger than each of the circulation holes 22b and the circulation holes 23b.

A pair of circulation holes 22b are formed in the first movable portion 22. Namely, a plurality of circulation holes 22b are formed for one first movable portion 22. The pair of circulation holes 22b are line-symmetrical with each other about the second axis X2. Each of the circulation holes 22b exhibits a semicircular ring shape, for example, when viewed in the Z axis direction. Each of the circulation holes 22b penetrates the first movable portion 22.

A pair of circulation holes 23b are formed in the second movable portion 23. Namely, a plurality of circulation holes 23b are formed for one second movable portion 23. The pair of circulation holes 23b are line-symmetrical with each other about the second axis X2. Each of the circulation holes 23b exhibits a semi-rectangular ring shape, for example, when viewed in the Z axis direction. Each of the circulation holes 23b extends along the outer edge of the second movable portion 23 when viewed in the Z axis direction. Each of the circulation holes 23b penetrates the second movable portion 23.

As illustrated in FIG. 2, the end surface 13a of the intermediate layer 13 is formed such that it is not recessed with respect to both the end surface 11a of the support layer 11 and the end surface 12a of the device layer 12. The end surface 13a of the intermediate layer 13, the end surface 11a of the support layer 11, and the end surface 12a of the device layer 12 are flush with each other. Similarly, the end surface 13b of the intermediate layer 13 is formed such that it is not recessed with respect to both the end surface 11b of the support layer 11 and the end surface 12b of the device layer 12. The end surface 13b of the intermediate layer 13, the end surface 11b of the support layer 11, and the end surface 12b of the device layer 12 are flush with each other.

The expression "the end surface of the intermediate layer is not recessed with respect to both the end surface of the support layer and the end surface of the device layer" means a state except for "the state in which the end surface of the intermediate layer is recessed from both the end surface of the support layer and the end surface of the device layer by an amount exceeding three times the thickness of the intermediate layer when the end surface of the intermediate layer is recessed with respect to both the end surface of the support layer and the end surface of the device layer". Therefore, it is possible to say that the end surface of the intermediate layer is not recessed with respect to both the end surface of the support layer and the end surface of the device layer not only in "the state in which the end surface of the intermediate layer, the end surface of the support layer, and the end surface of the device layer are flush with each other" but also in "the state in which the end surface of the intermediate layer is recessed from both the end surface of the support layer and the end surface of the device layer by an amount of 0.5 times the thickness of the intermediate layer even when the end surface of the intermediate layer is recessed with respect to both the end surface of the support layer and the end surface of the device layer".

The end surface 13a of the intermediate layer 13 is recessed with respect to both the end surface 11a of the support layer 11 and the end surface 12a of the device layer 12 by an amount of preferably three times or smaller, more preferably two times or smaller, further preferably one time or smaller, and most preferably 0.5 times or smaller than the thickness of the intermediate layer 13. In other words, the end surface 13a of the intermediate layer 13 is not recessed with respect to both the end surface 11a of the support layer 11 and the end surface 12a of the device layer 12 by an amount preferably exceeding three times, more preferably exceeding two times, further preferably exceeding one time, and most preferably exceeding 0.5 times the thickness of the intermediate layer 13. Similarly, the end surface 13b of the intermediate layer 13 is recessed with respect to both the end surface 11b of the support layer 11 and the end surface 12b of the device layer 12 by an amount of preferably three times or smaller, more preferably two times or smaller, further preferably one time or smaller, and most preferably 0.5 times or smaller than the thickness of the intermediate layer 13. In other words, the end surface 13b of the intermediate layer 13 is not recessed with respect to both the end surface 11b of the support layer 11 and the end surface 12b of the device layer 12 by an amount preferably exceeding three times, more preferably exceeding two times, further preferably exceeding one time, and most preferably exceeding 0.5 times the thickness of the intermediate layer 13.

The mirror layer 3 is provided on the first movable portion 22. Specifically, the mirror layer 3 is provided on a region corresponding to the first movable portion 22 on the first front surface 2a of the structure 2A. The mirror layer 3 is disposed on a side inward from the pair of circulation holes 22b when viewed in the Z axis direction. The mirror layer 3 exhibits a circular shape, for example, when viewed in the Z axis direction. The mirror layer 3 is disposed with the intersection between the first axis X1 and the second axis X2 as a center position (centroid position). For example, the mirror layer 3 is constituted of a reflection film formed of aluminum, an aluminum-based alloy, silver, a silver-based alloy, gold, a dielectric multi-layer film, or the like.

The straightening layer 4 is formed on the entire second front surface 2b. Specifically, in the base portion 21, the straightening layer 4 is formed on a surface on a side opposite to the intermediate layer 13 in the support layer 11. In the first movable portion 22, the second movable portion 23, each of the first coupling portions 24, and each of the second coupling portions 25, the straightening layer 4 is formed on a surface on a side opposite to the mirror layer 3 in the device layer 12. The straightening layer 4 straightens warpage or the like of the first movable portion 22, the second movable portion 23, each of the first coupling portions 24, and each of the second coupling portions 25. For example, the straightening layer 4 is constituted using a material such as silicon oxide or silicon nitride. For example, the straightening layer 4 may be a metal thin film of aluminum or the like. For example, the thickness of the straightening layer 4 is approximately 10 nm to 1,000 nm.

The mirror device 1A further includes a first coil 221 and a second coil 231. For example, the first coil 221 is embedded in the first movable portion 22 and extends in a spiral shape on a side outward from the pair of circulation holes 22b (an outer edge portion of the first movable portion 22) when viewed in the Z axis direction. For example, the second coil 231 is embedded in the second movable portion 23 and extends in a spiral shape on a side outward from the pair of circulation holes 23b (an outer edge portion of the second movable portion 23) when viewed in the Z axis direction. For example, the first coil 221 and the second coil 231 are constituted using a metal material such as copper. In FIG. 2, illustration of the first coil 221 and the second coil 231 is omitted.

In the mirror device 1A constituted as above, the first movable portion 22 provided with the mirror layer 3 swings around the first axis X1 and the second axis X2 orthogonal to each other. Specifically, when a drive signal for linear operation is input to the second coil 231 via an electrode pad (not illustrated) and a wiring (not illustrated) provided in the structure 2A, a Lorentz force acts on the second coil 231 due to an interaction with respect to a magnetic field generated by a magnetic field generation portion (not illustrated). The mirror layer 3 (first movable portion 22) can be subjected to linear operation together with the second movable portion 23 around the second axis X2 by utilizing the balance between the Lorentz force and an elastic force of each of the second coupling portions 25.

Meanwhile, when a drive signal for resonance operation is input to the first coil 221 via an electrode pad and a wiring, a Lorentz force acts on the first coil 221 due to an interaction with respect to a magnetic field generated by a magnetic field generation portion. The mirror layer 3 (first movable portion 22) can be subjected to resonance operation around the first axis X1 by utilizing resonance of the first movable portion 22 in a resonance frequency in addition to the Lorentz force.

Figure 3:
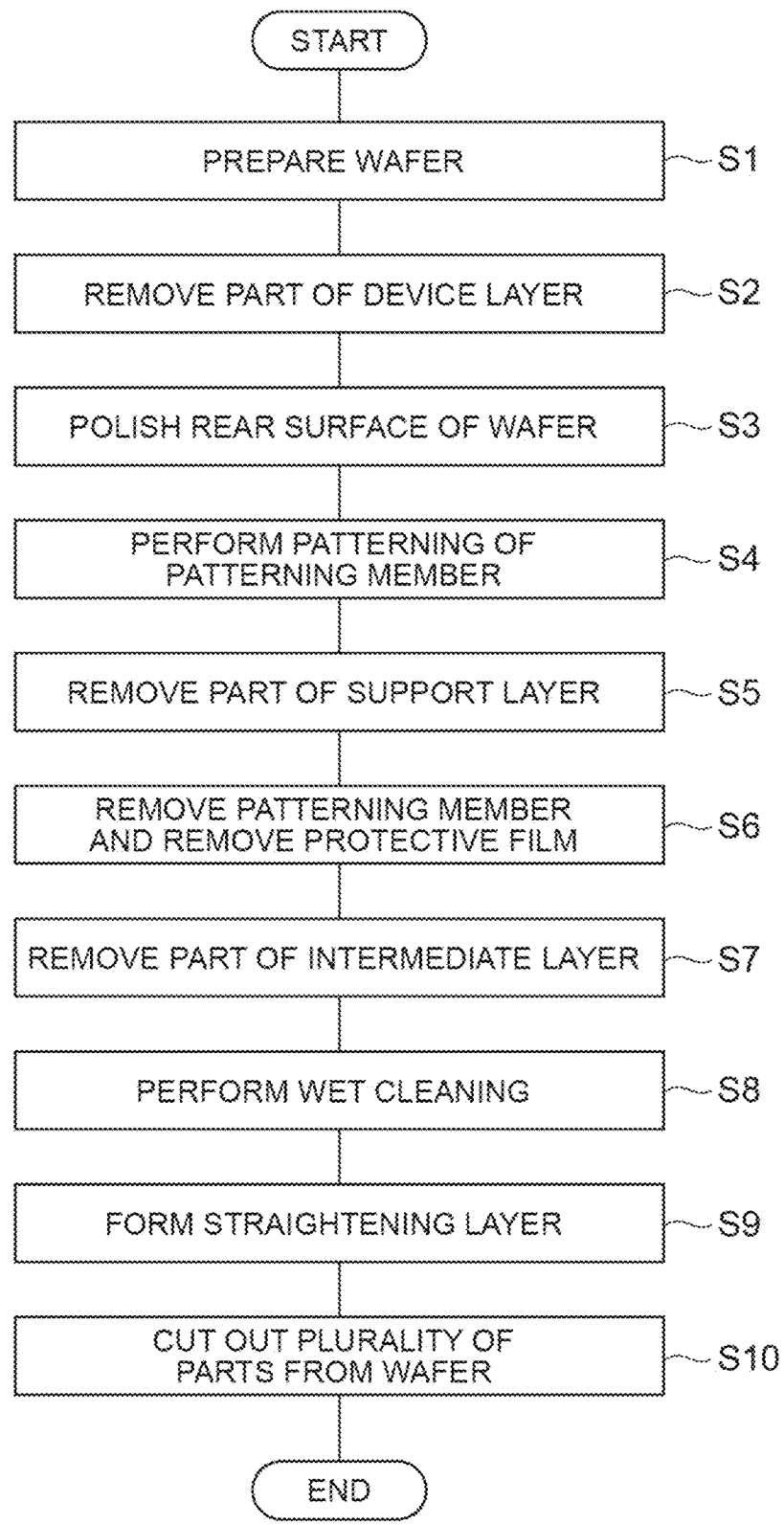
FIG. 3 is a flowchart of a method for manufacturing the mirror device illustrated in FIG. 1.

Next, a method for manufacturing the mirror device 1A will be described. First, as illustrated in FIG. 3 and (a) in FIG. 4, a wafer 10W having the support layer 11, the device layer 12, and the intermediate layer 13 is prepared (Step S1, first step). The wafer 10W has a front surface (first front surface) 10a and a rear surface (second front surface) 10b on a side opposite to the front surface 10a. The front surface 10a is a surface serving as the first front surface 2a of the structure 2A. The wafer 10W includes a plurality of parts 11W each serving as the structure 2A. The part 11W is a part of the wafer 10W before the structure 2A is formed. Each step of the method for manufacturing the mirror device 1A is performed at a level of a wafer. In FIGS. 4, 5, 7, and 9, one part 11W of the wafer 10W is illustrated. Hereinafter, description will be given focusing on one part 11W of the wafer 10W.

Figure 7:
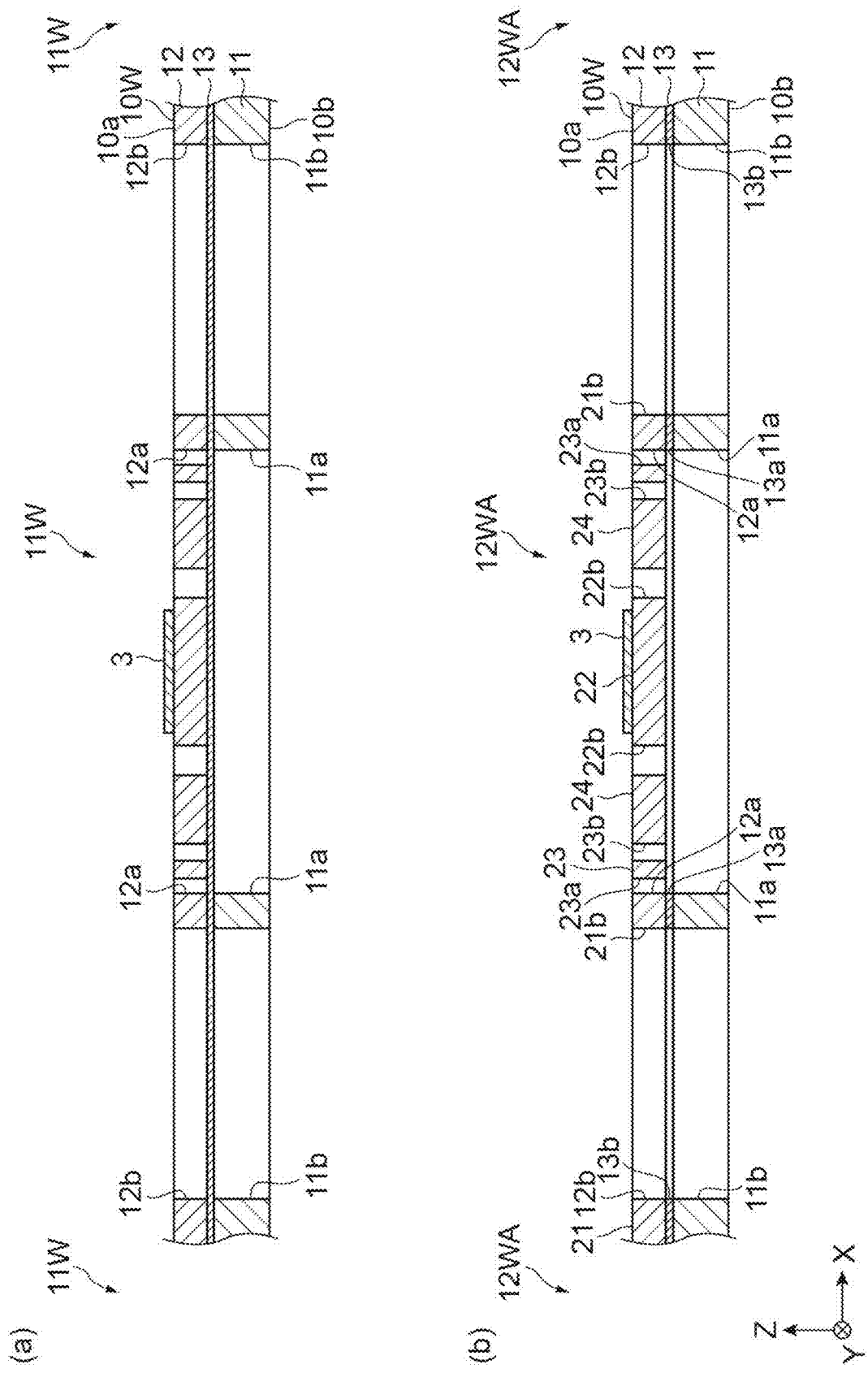
FIG. 7 is a cross-sectional view for describing the method for manufacturing the mirror device illustrated in FIG. 1.

Subsequently, the first slit 22a and the second slit 23a are formed in the wafer 10W such that the first movable portion 22 and the second movable portion 23 are movable with respect to the base portion 21 by removing a part of each of the support layer 11, the device layer 12, and the intermediate layer 13 from the wafer 10W, and a plurality of parts 12WA (refer to (b) in FIG. 7) each corresponding to the structure 2A are formed in the wafer 10W (second step). A part 12WA is a part of the wafer 10W in which the structure 2A is formed. First, a part of the device layer 12 is removed from the wafer 10W by etching (Step S2). Specifically, parts corresponding to the first slit 22a, the second slit 23a, and the circulation holes 21b, 22b, and 23b in the device layer 12 are removed. As a result, the end surface 12a and the end surface 12b of the device layer 12 are formed. In Step S2, the first coil 221 and the second coil 231 as well as an electrode pad, a wiring, and the like for inputting a drive signal to the first coil 221 and the second coil 231 are provided in the device layer 12. In Step S2, the mirror layer 3 is formed at a part corresponding to the first movable portion 22 on the front surface 10a of the wafer 10W. For example, the mirror layer 3 is formed by vapor deposition of a metal. In Step S2, a patterning member used for removing the device layer 12 is removed from the wafer 10W by patterning member removal (which will be described below in detail) for removing a patterning member.

Subsequently, as illustrated in (b) in FIG. 4, the rear surface 10b of the wafer 10W is polished (Step S3). The wafer 10W is thinned as the rear surface 10b is polished. The polished rear surface 10b of the wafer 10W is a surface serving as a part of the second front surface 2b of the structure 2A.

Figure 5:
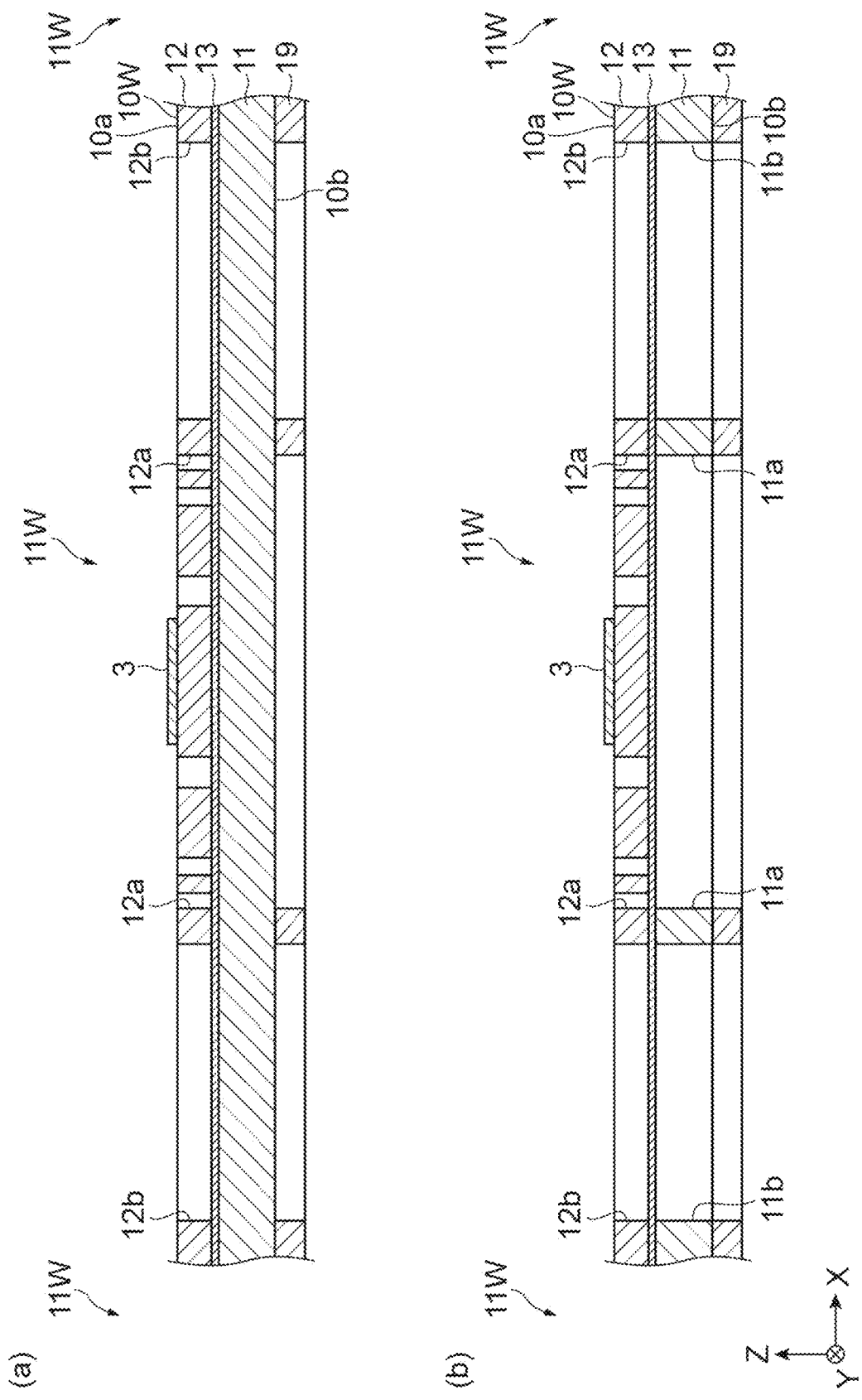
FIG. 5 is a cross-sectional view for describing the method for manufacturing the mirror device illustrated in FIG. 1.

Subsequently, as illustrated in (a) in FIG. 5, a patterning member 19 is patterned on the rear surface 10b of the wafer 10W (Step S4). Specifically, the patterning member 19 is provided in a region corresponding to the base portion 21 on the rear surface 10b, that is, a region excluding regions corresponding to the circulation holes 21b. For example, the patterning member 19 is a resist or the like. Subsequently, as illustrated in (b) in FIG. 5, a part of the support layer 11 is removed from the wafer 10W by etching via the patterning member 19 (Step S5). Specifically, a part on a side inward from a part corresponding to the base portion 2 land parts corresponding to the circulation holes 21b in the support layer 11 are removed. As a result, the end surface 11a and the end surface 11b of the support layer 11 are formed. In Step S5, a part of the support layer 11 is removed from the wafer 10W such that the end surface 11a and the end surface 11b of the support layer 11 respectively become flush with the end surface 12a and the end surface 12b of the device layer 12. For example, a part of the support layer 11 is removed by reactive ion etching using a Bosch process (DRIE). In Step S5, when a part of the support layer 11 is removed from the wafer 10W, a polymer or the like is used as a protective film, for example.

Subsequently, as illustrated in FIG. 6, patterning member removal and protective film removal are performed (Step S6). First, the patterning member removal is performed. The patterning member removal is a step for removing (peeling) the patterning member 19 from the rear surface 10b of the wafer 10W. In the patterning member removal, after a part of the support layer 11 is removed from the wafer 10W, the patterning member 19 is removed by a wet process. Specifically, first, a plurality of wafers 10W are set inside a carrier 50 exhibiting a box shape.

A plurality of grooves (not illustrated) arranged at predetermined intervals in the Z axis direction are formed on an inner wall surface of the carrier 50. The grooves extend along an XY plane. In the patterning member removal, the wafers 10W are fitted into the respective grooves so that the plurality of wafers 10W are disposed in the Z axis direction (the thickness direction of the wafers 10W). That is, different wafers 10W having the same structure as the wafer 10W are respectively disposed on one side and the other side of the wafers 10W in the Z axis direction. A second region R2 is formed between the wafer 10W and a different wafer 10W which are adjacent to each other. Subsequently, the patterning member 19 is removed in a state in which a patterning member removing liquid is present in the second region R2. Specifically, as described above, the plurality of wafers 10W and the different wafers 10W are immersed in the patterning member removing liquid in a state in which the plurality of wafers 10W and the different wafers 10W are set inside the carrier 50. For example, the patterning member removing liquid is accommodated in a pool. The plurality of wafers 10W and the different wafers 10W are immersed in the patterning member removing liquid such that the direction of an opening of the carrier 50 becomes the same as the direction of a liquid level of the patterning member removing liquid. The patterning member removing liquid is a liquid chemical or the like for removing the patterning member 19 from the wafers 10W.

Subsequently, in a state in which the plurality of wafers 10W are immersed in the patterning member removing liquid, the plurality of wafers 10W are reciprocated (swing) in the X axis direction (a direction intersecting the thickness direction of the wafers 10W and the liquid level of the patterning member removing liquid). Reciprocating of the plurality of wafers 10W is performed by reciprocating the carrier 50. In the patterning member removal, the plurality of wafers 10W are reciprocated for a second time at a second speed. The expression "a speed for reciprocating" denotes the number of times of reciprocating per unit time. For example, the second speed is approximately 70 times/min. For example, the second time is approximately 40 minutes. The second time is a total of times of reciprocating the plurality of wafers 10W at the second speed. In the patterning member removal, for example, the kind of the patterning member removing liquid may be varied, or reciprocating of the plurality of wafers 10W may be temporarily stopped. In the patterning member removal, after the patterning member 19 is removed by the wet process, the plurality of wafers 10W are immersed in water for a predetermined time, for example.

In the patterning member removal, after the patterning member 19 is removed, namely, after the wafers 10W are immersed in water for a predetermined time, second spin-drying of drying the wafers 10W is performed. In the second spin-drying, the wafers 10W are dried by rotating the wafers 10W for a fourth time at a second rotation speed. After the patterning member removal is performed, the patterning member 19 is removed from the wafers 10W, as illustrated in (a) in FIG. 7.

Subsequently, the protective film removal is performed. The protective film removal is a step for removing a polymer or the like used as a protective film from the wafers 10W in Step S5. In the protective film removal, after a part of the support layer 11 is removed from the wafers 10W, the protective film is removed by a wet process using a protective film removing liquid. The protective film removing liquid is a liquid chemical or the like for removing a polymer or the like from the wafer 10W.

Subsequently, as illustrated in (b) in FIG. 7, a part of the intermediate layer 13 is removed from the wafers 10W by etching (Step S7). Specifically, in the intermediate layer 13, a part on a side inward from a part corresponding to the base portion 21 and parts corresponding to the circulation holes 21b are removed. As a result, the first slit 22a and the second slit 23a are formed. At this time, the end surface 13a of the intermediate layer 13 is formed. In Step S7, the plurality of parts 12WA each corresponding to the structure 2A are formed in the wafers 10W by forming the first slit 22a and the second slit 23a in the wafers 10W such that the first movable portion 22 and the second movable portion 23 are movable with respect to the base portion 21, and the plurality of parts 12WA are brought to completion. Namely, a plurality of first movable portions 22 and a plurality of second movable portions 23 are released. The term "released" denotes that the first movable portion or the second movable portion is shifted from a fixed state to a movable state with respect to the base portion.

In Step S7, the first slit 22a and the second slit 23a are formed such that each of the first movable portions 22 and the second movable portions 23 is supported on the base portion 21 by each of the first coupling portions 24 and each of the second coupling portions 25.

In addition, in Step S7, as described above, the plurality of circulation holes 21b, 22b, and 23b penetrating the wafer 10W are formed at parts other than the first slit 22a and the second slit 23a in the wafers 10W by removing a part of the intermediate layer 13 from the wafers 10W. Specifically, in Step S7, the circulation holes 21b penetrating the wafer 10W are formed at parts corresponding to the base portion 21 in the wafers 10W, the circulation holes 22b penetrating the wafer 10W are formed at parts corresponding to the first movable portions 22, and the circulation holes 23b penetrating the wafer 10W are formed at a part corresponding to the second movable portion 23. At this time, the end surface 13b of the intermediate layer 13 is formed.

In Step S7, etching is performed such that the end surface 13a of the intermediate layer 13 is not recessed with respect to both the end surface 11a of the support layer 11 and the end surface 12a of the device layer 12. In Step S7, etching is performed such that the end surface 13a of the intermediate layer 13 becomes flush with the end surface 11a of the support layer 11 and the end surface 12a of the device layer 12. Similarly, in Step S7, etching is performed such that the end surface 13b of the intermediate layer 13 is not recessed with respect to both the end surface 11b of the support layer 11 and the end surface 12b of the device layer 12. In Step S7, etching is performed such that the end surface 13b of the intermediate layer 13 becomes flush with the end surface 11b of the support layer 11 and the end surface 12b of the device layer 12. In Step S7, a part of the intermediate layer 13 is removed from the wafers 10W by anisotropic etching. In Step S7, a part of the intermediate layer 13 is removed from the wafers 10W by dry etching.

Figure 8:
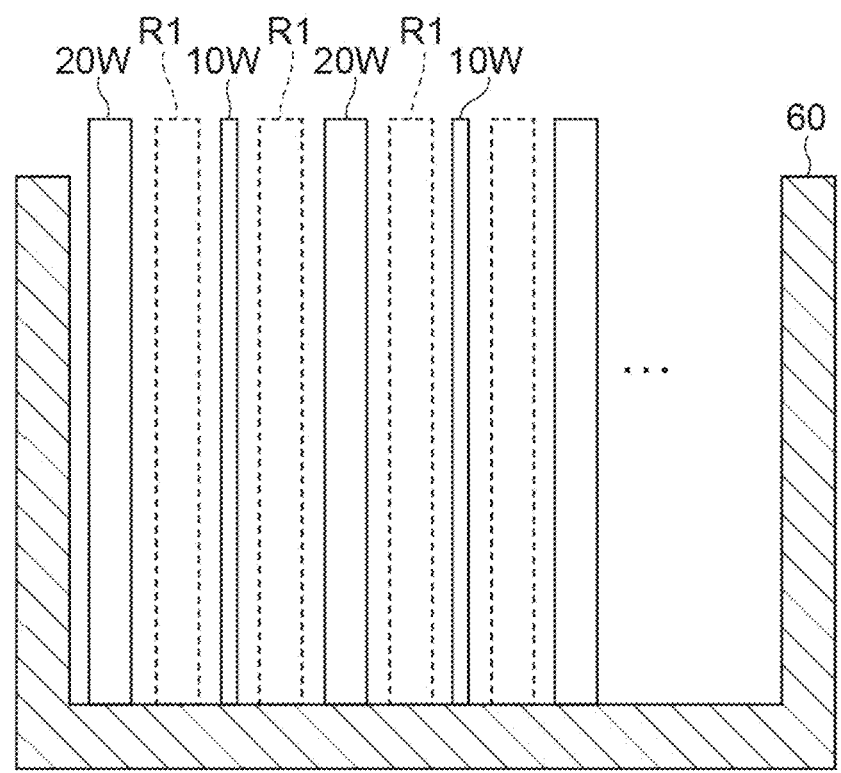
FIG. 8 is a view of a constitution for describing wet cleaning in the method for manufacturing the mirror device illustrated in FIG. 1.

Subsequently, as illustrated in FIG. 8, wet cleaning is performed (Step S8, third step). The wet cleaning is cleaning for removing a foreign substance or the like adhered to the wafers 10W. In the wet cleaning, the wafers 10W are cleaned using a cleaning liquid (not illustrated). Specifically, first, a plurality of wafers 10W and a plurality of dummy wafers (monitoring wafers) 20W are set inside a carrier 60 exhibiting a box shape. For example, the thicknesses of the dummy wafer 20W is approximately 625 μm.

A plurality of grooves (not illustrated) arranged at predetermined intervals in the Z axis direction are formed on an inner wall surface of the carrier 60. The grooves extend along an XY plane. In the wet cleaning, the wafers 10W and the dummy wafers 20W are fitted into the respective grooves so that the plurality of wafers 10W and the plurality of dummy wafers 20W are alternately disposed in the Z axis direction (the thickness direction of the wafers 10W and the dummy wafers 20W). That is, the dummy wafers 20W are respectively disposed on one side and the other side of the wafers 10W in the Z axis direction. A first region R1 is formed between the wafer 10W and the dummy wafer 20W which are adjacent to each other. The width of the first region R1 in the Z axis direction is larger than the width of the second region R2 in the Z axis direction.

Subsequently, the wafers 10W are cleaned in a state in which the cleaning liquid is present in the first region R1. Specifically, as described above, the plurality of wafers 10W and the plurality of dummy wafers 20W are immersed in the cleaning liquid in a state in which the plurality of wafers 10W and the plurality of dummy wafers 20W are set inside the carrier 60. For example, the cleaning liquid is accommodated in a pool. The plurality of wafers 10W and the plurality of dummy wafers 20W are immersed in the cleaning liquid such that the direction of an opening of the carrier 60 becomes the same as the direction of a liquid level of the cleaning liquid. The cleaning liquid is a liquid chemical or the like for removing a foreign substance or the like from the wafers 10W. Subsequently, in a state in which the plurality of wafers 10W and the plurality of dummy wafers 20W are immersed in the cleaning liquid, the plurality of wafers 10W and the plurality of dummy wafers 20W are reciprocated (swing) in the X axis direction (a direction intersecting the thickness direction of the wafers 10W and the liquid level of the cleaning liquid). Reciprocating of the plurality of wafers 10W and the plurality of dummy wafers 20W is performed by reciprocating the carrier 60.

In the wet cleaning, the plurality of wafers 10W and the plurality of dummy wafers 20W are reciprocated for a first time at a first speed. A load applied to the wafers 10W during the wet cleaning in Step S8 is smaller than a load applied to the wafers 10W during the patterning member removal in Step S6. Namely, the intensity of the wet cleaning in Step S8 is smaller than the intensity of the patterning member removal in Step S6. Similarly, a load applied to the wafers 10W during the wet cleaning in Step S8 is smaller than a load applied to the wafers 10W during the protective film removal in Step S6. Namely, the intensity of the wet cleaning in Step S8 is smaller than the intensity of the protective film removal in Step S6. The expression "a load applied to the wafers" denotes a magnitude of mechanical work (energy) applied to wafers. For example, during the wet cleaning in Step S8, the higher the speed of reciprocating the wafers 10W, the greater the load applied to the wafers 10W. In addition, for example, during the wet cleaning in Step S8, the longer the time of reciprocating the wafers 10W, the greater the load applied to the wafers 10W.

The first speed is lower than the second speed. For example, the first speed is approximately 40 times/min. The first time is shorter than the second time. For example, the first time is approximately 20 minutes. The first time is a total of times of reciprocating the plurality of wafers 10W and the plurality of dummy wafers 20W at the first speed. In the wet cleaning, for example, the kind of the cleaning liquid may be varied, or reciprocating of the plurality of wafers 10W and the plurality of dummy wafers 20W may be temporarily stopped. In the wet cleaning, after the wafers 10W are cleaned using the cleaning liquid, the plurality of wafers 10W and the plurality of dummy wafers 20W are immersed in water for a predetermined time, for example.

In the wet cleaning, after the wafers 10W are cleaned, namely, after the wafers 10W are immersed in water for a predetermined time, first spin-drying of drying the wafers 10W is performed. In the first spin-drying, the wafers 10W are rotated for a third time at a first rotation speed. A load applied to the wafers 10W during the first spin-drying in Step S8 is smaller than a load applied to the wafers 10W during the second spin-drying in Step S6. Namely, the intensity of the first spin-drying in Step S8 is smaller than the intensity of the second spin-drying in Step S6. For example, during the first spin-drying in Step S8, the higher the rotation speed of rotating the wafers 10W, the greater the load applied to the wafers 10W. In addition, for example, during the first spin-drying in Step S8, the longer the time of rotating the wafers 10W, the greater the load applied to the wafers 10W. The first rotation speed is lower than the second rotation speed. For example, the first rotation speed is approximately 200 rpm. For example, the third time is approximately five minutes.

Figure 9:
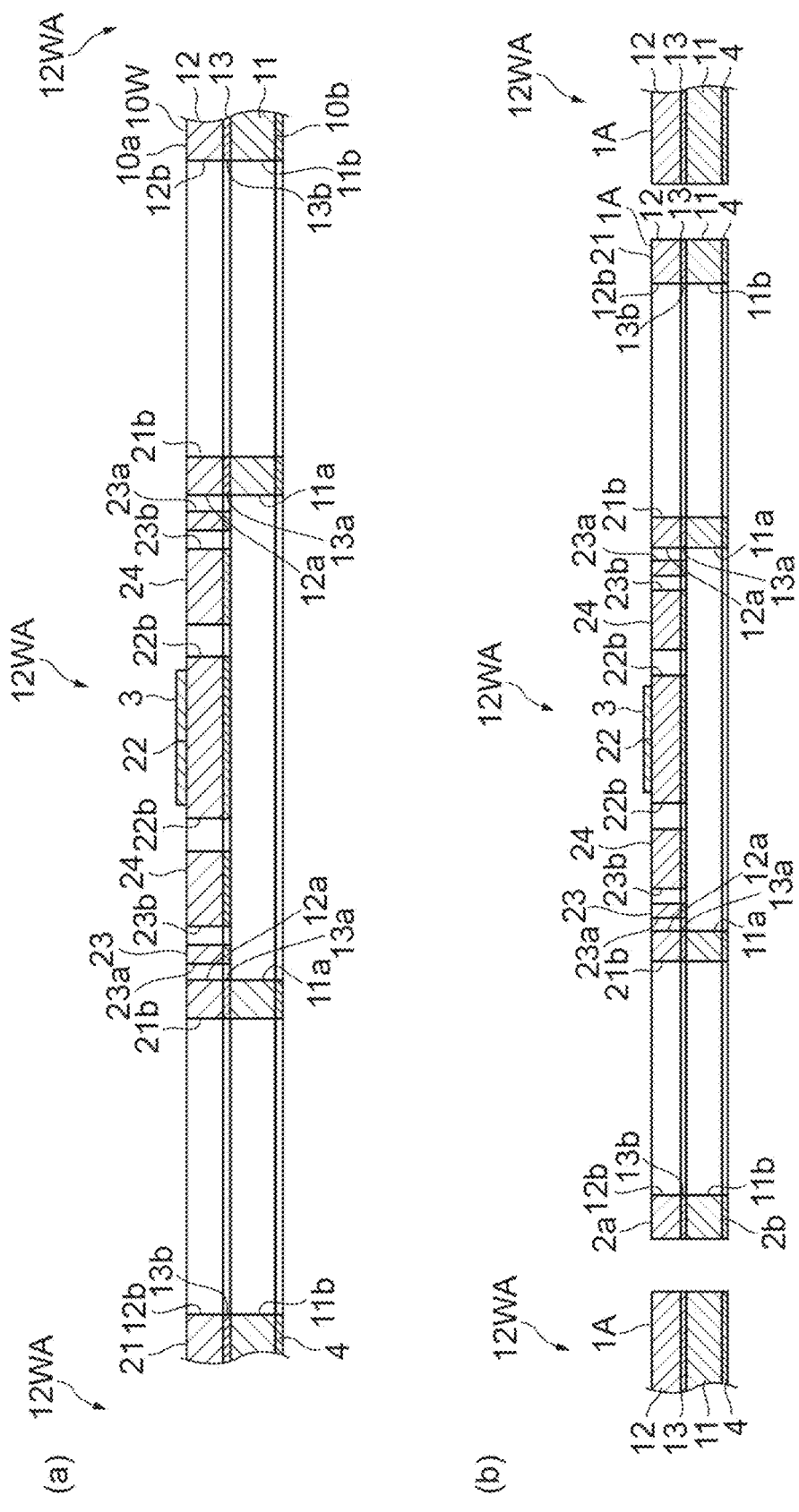
FIG. 9 is a cross-sectional view for describing the method for manufacturing the mirror device illustrated in FIG. 1.

Subsequently, as illustrated in (a) in FIG. 9, the straightening layer 4 is formed on the rear surface 10b on a side opposite to the front surface 10a, of surfaces of the wafer 10W, where the mirror layer 3 is formed (Step S9, fifth step). The straightening layer 4 is formed on a surface on a side opposite to the mirror layer 3 in each of the support layer 11 and the device layer 12. Subsequently, as illustrated in (b) in FIG. 9, each of the plurality of parts 12WA are cut out from the wafer 10W (Step S10, fourth step). Accordingly, a plurality of mirror devices 1A are manufactured.

As described above, in the method for manufacturing the mirror device 1A, in Step S8 (third step), the wafers 10W, in which the plurality of first movable portions 22 and second movable portions 23 are released, are cleaned with the cleaning liquid. Accordingly, a foreign substance can be removed from the wafers 10W in which the plurality of first movable portions 22 and second movable portions 23 are released. When the wafers 10W, in which the plurality of first movable portions 22 and second movable portions 23 are released, are cleaned by the wet cleaning in Step S8, the plurality of first movable portions 22 and second movable portions 23 are likely to be damaged. Here, in Step S7 (second step), each of the circulation holes 21b, 22b, and 23b penetrating the wafer 10W is formed at parts other than the first slit 22a and the second slit 23a in the wafer 10W by etching. For this reason, during the wet cleaning in Step S8, while the cleaning liquid is circulated via the circulation holes 21b, 22b, and 23b, the wafers 10W in which the plurality of first movable portions 22 and second movable portions 23 are released can be cleaned. Therefore, a load received by the plurality of first movable portions 22 and second movable portions 23 due to the cleaning liquid can be reduced, and occurrence of damage to the plurality of first movable portions 22 and second movable portions 23 can be curbed. Thus, according to the method for manufacturing the mirror device 1A, occurrence of damage to the mirror device 1A and a foreign substance remaining can be curbed. In addition, the cleaning liquid is easily circulated via the circulation holes 21b, 22b, and 23b between one side and the other side of the wafer 10W in the Z axis direction. For this reason, cleaning efficiency in the wet cleaning is improved.

In addition, in the method for manufacturing the mirror device 1A, in Step S2, the mirror layer 3 is formed to the wafer 10W at a part corresponding to the first movable portion 22. Accordingly, a foreign substance adhered to the mirror layer 3 can be removed by the wet cleaning in Step S8.

In addition, the method for manufacturing the mirror device 1A includes Step S9 of forming the straightening layer 4 on the rear surface 10b of the wafer 10W between Step S8 and Step S10. Accordingly, covering of a foreign substance by the straightening layer 4 can be curbed.

In addition, in the method for manufacturing the mirror device 1A, in Step S6, protective film removal for removing a protective film is performed after a part of the support layer 11 is removed from the wafer 10W, and the plurality of parts 12WA are brought to completion after the protective film removal. In addition, in the method for manufacturing the mirror device 1A, during the protective film removal in Step S6, the protective film is removed by the wet process. When a part of the support layer 11 is removed from the wafer 10W, as described above, a polymer or the like is used as the protective film. The polymer may remain in the wafer 10W after a part of the support layer 11 is removed from the wafer 10W. In addition, due to a situation in which the wafer 10W has a shape with unevenness caused when a part of the device layer 12 is removed from the wafer 10W, a situation in which a part of the intermediate layer 13 is not yet removed from the wafer 10W, or the like, in the protective film removal, the protective film removing liquid may remain on the front surface of the mirror layer 3 or the like formed in the wafer 10W. When the remaining protective film removing liquid dries, there is concern that stain may occur. When a polymer, stain, or the like remains in the wafer 10W, there is concern that the presence of the polymer, stain, or the like may cause poor appearance of the mirror device 1A and the yield thereof may decrease. According to the method for manufacturing the mirror device 1A, a polymer (foreign substance) or the like remaining in the wafer 10W can be removed by the protective film removal when a part of the support layer 11 is removed from the wafer 10W. Moreover, stain (foreign substance) or the like remaining in the wafer 10W can be removed by the wet cleaning in Step S8 when the protective film is removed. Accordingly, decrease in yield due to poor appearance of the mirror device 1A can be curbed.

In addition, in the method for manufacturing the mirror device 1A, in Step S6, patterning member removal for removing the patterning member 19 is performed, and the plurality of parts 12WA are brought to completion after the patterning member removal. Accordingly, since the patterning member 19 is removed before the plurality of first movable portions 22 and second movable portions 23 are released, occurrence of damage to the mirror device 1A due to the patterning member removal can be curbed.

In addition, in the method for manufacturing the mirror device 1A, in the patterning member removal in Step S6 the patterning member 19 is removed by the wet process. Accordingly, since the patterning member 19 is removed before the plurality of first movable portions 22 and second movable portions 23 are released, even if the patterning member 19 is removed by the wet process, occurrence of damage to the mirror device 1A can be curbed.

In addition, in the method for manufacturing the mirror device 1A, in Step S7, the plurality of circulation holes 22b and the plurality of circulation holes 23b are formed at parts respectively corresponding to the first movable portion 22 and the second movable portion 23. Accordingly, during the wet cleaning in Step S8, a turbulent flow of the cleaning liquid is likely to be generated in the vicinity of the first movable portion 22 and the second movable portion 23. Therefore, a foreign substance can be reliably removed from parts corresponding to the first movable portion 22 and the second movable portion 23. In addition, a foreign substance can be reliably removed from the mirror layer 3.

In addition, in the method for manufacturing the mirror device 1A, in Step S7, the circulation holes 21b are formed at a part corresponding to the base portion 21. Accordingly, during the wet cleaning in Step S8, a larger amount of cleaning liquid can be circulated via the circulation holes 21b in addition to the circulation holes 22b and 23b. Therefore, a load received by the wafer 10W due to the cleaning liquid can be more reliably reduced, and occurrence of damage to the wafer 10W can be more reliably curbed. In addition, cleaning efficiency in the wet cleaning is reliably improved.

Second Embodiment

Figure 10:
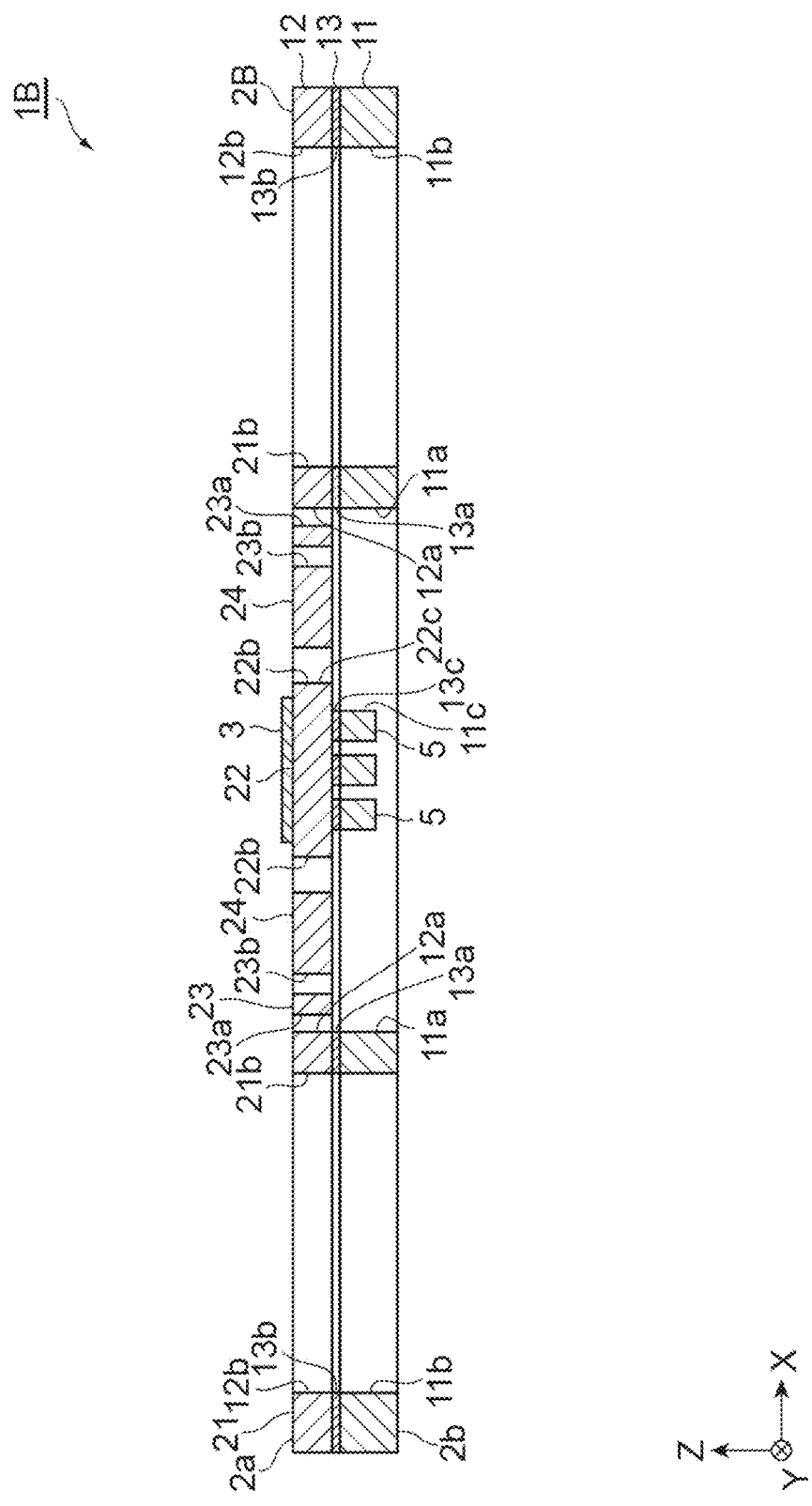
FIG. 10 is a cross-sectional view of a mirror device of a second embodiment.

As illustrated in FIG. 10, a mirror device 1B of a second embodiment mainly differs from the mirror device 1A of the first embodiment in that a beam portion 5 is provided in place of the straightening layer 4. The mirror device 1B is otherwise similar to the mirror device 1A, and thus detailed description thereof will be omitted.

A structure 2B of the mirror device 1B includes a plurality of beam portions 5. Each beam portion 5 is constituted of the support layer 11 and a part of the intermediate layer 13. The beam portion 5 is provided in the first movable portion 22. The beam portion 5 is provided on a surface on a side opposite to the mirror layer 3 of the device layer 12. For example, the beam portion 5 linearly extends in the Y axis direction. The plurality of beam portions 5 are arranged at predetermined intervals in the X axis direction. The plurality of beam portions 5 may be disposed such that they exhibit radial shapes, for example, when viewed in the Z axis direction. The structure 2B may include one beam portion 5. In this case, the beam portion 5 may exhibit a circular ring shape, for example, when viewed in the Z axis direction. Namely, the beam portion 5 may exhibit a cylindrical shape. The beam portion 5 may exhibit various shapes. The beam portion 5 is provided so as to reinforce the structure 2B. In the beam portion 5, an end surface 11c of the support layer 11 is formed such that it is not recessed with respect to an end surface 13c of the intermediate layer 13. The end surface 11c of the support layer 11 and the end surface 13c of the intermediate layer 13 are flush with each other. When viewed in the Z axis direction, the end surface 11c of the support layer 11 and the end surface 13c of the intermediate layer 13 are positioned on a side inward from an end surface 22c of the first movable portion 22 (an end surface where the circulation holes 22b are formed).

Next, a method for manufacturing the mirror device 1B will be described. The method for manufacturing the mirror device 1B mainly differs from the method for manufacturing the mirror device 1A of the first embodiment in that the beam portions 5 are formed in place of the straightening layer 4. The method for manufacturing the mirror device 1B is otherwise similar to the method for manufacturing the mirror device 1A of the first embodiment, and thus detailed description thereof will be omitted.

Figure 4:
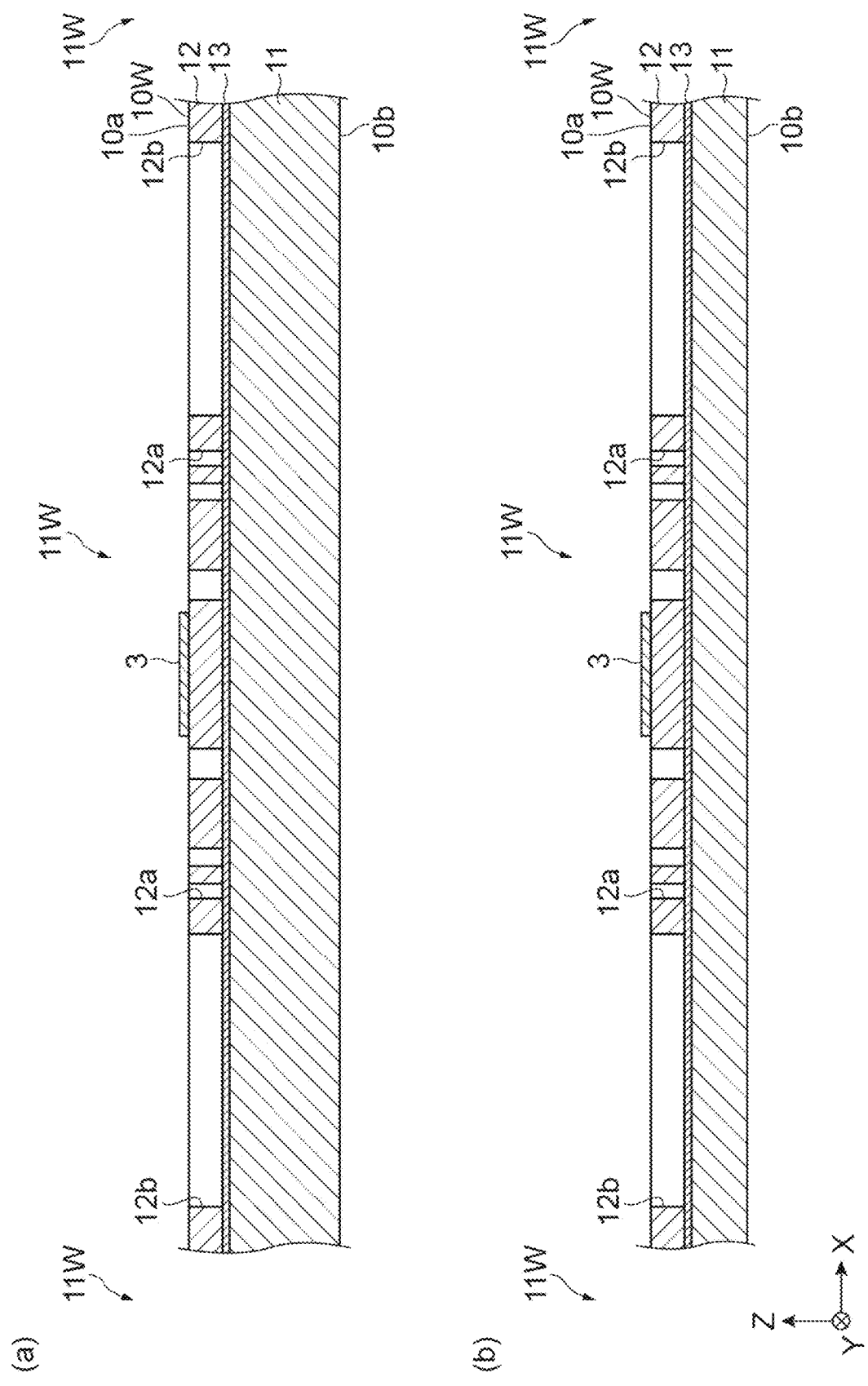
FIG. 4 is a cross-sectional view for describing the method for manufacturing the mirror device illustrated in FIG. 1.
Figure 11:
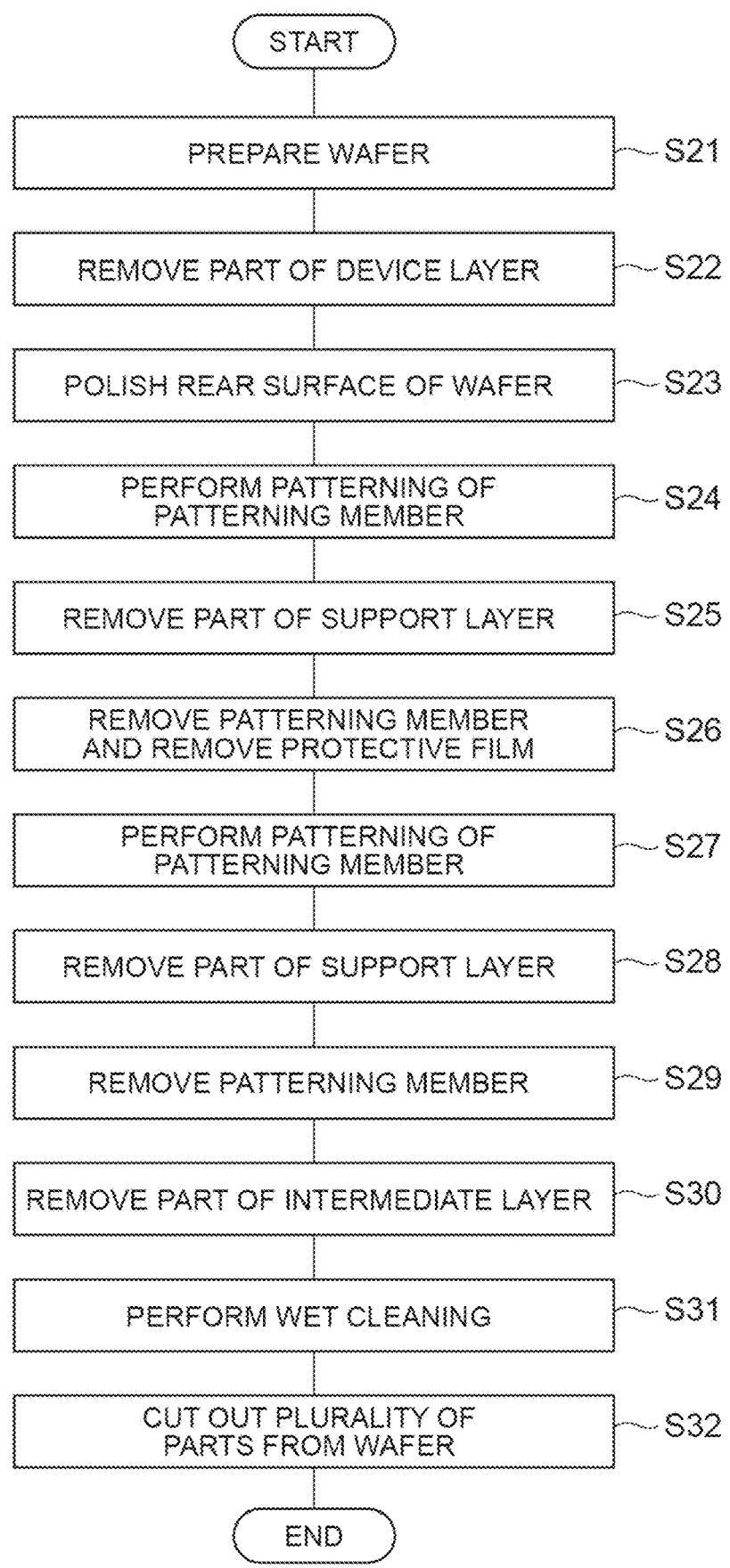
FIG. 11 is a flowchart of the method for manufacturing the mirror device illustrated in FIG. 10.
Figure 15:
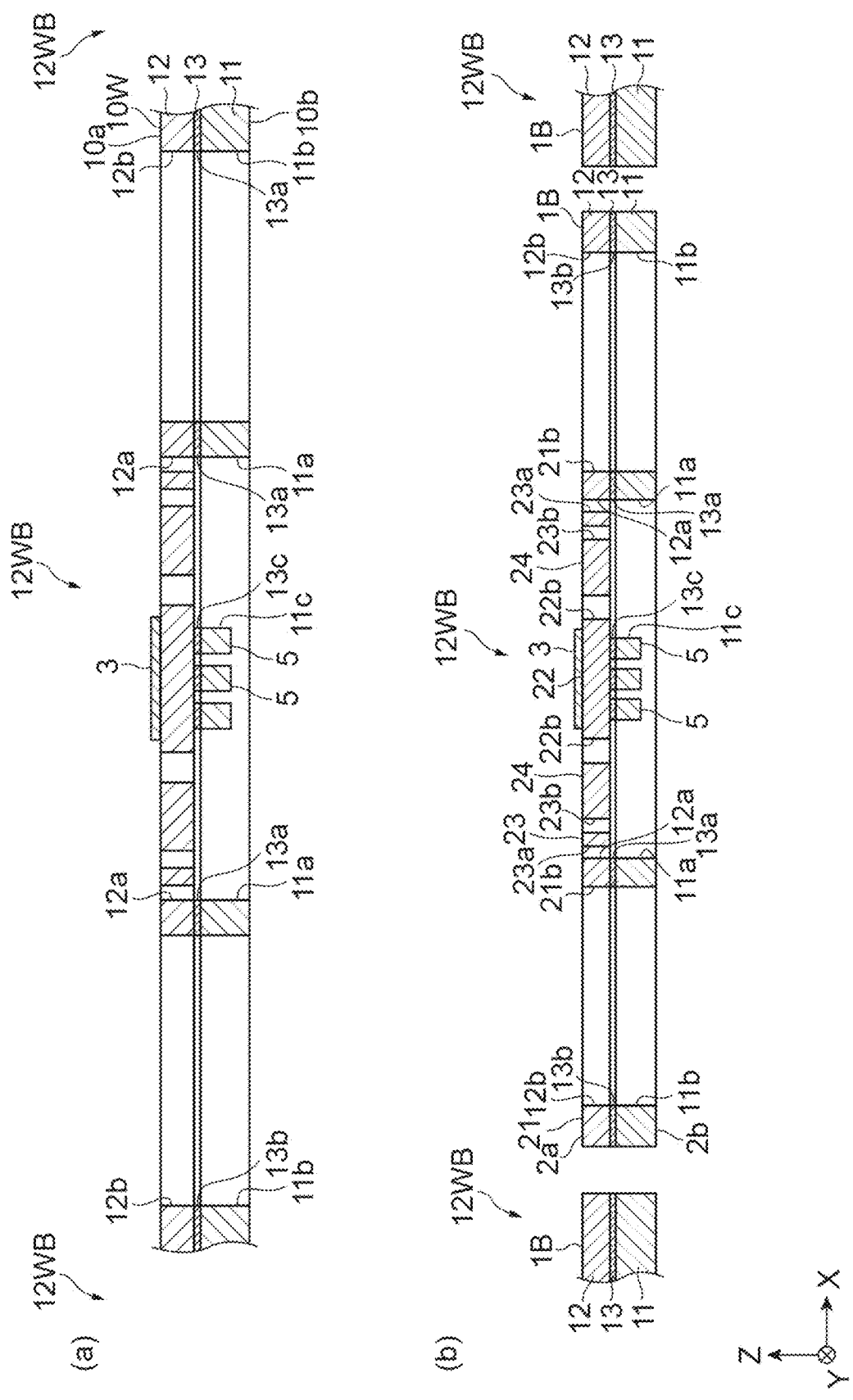
FIG. 15 is a cross-sectional view for describing the method for manufacturing the mirror device illustrated in FIG. 10.

First, as illustrated in FIG. 11, similar to Step S1 (refer to (a) in FIG. 4) of the first embodiment, the wafer 10W is prepared (Step S21, first step). Subsequently, similar to the first embodiment, the first slit 22a and the second slit 23a are formed in the wafer 10W such that the first movable portion 22 and the second movable portion 23 are movable with respect to the base portion 21 by removing a part of each of the support layer 11, the device layer 12, and the intermediate layer 13 from the wafer 10W by etching, and a plurality of parts 12WB (refer to (a) in FIG. 15) each corresponding to the structure 2B are formed in the wafer 10W (second step). First, similar to Step S2 of the first embodiment, a part of the device layer 12 is removed from the wafer 10W by etching (Step S22). In Step S22, the first coil 221, the second coil 231, an electrode pad, a wiring, and the like are provided in the device layer 12, and the mirror layer 3 is formed on the front surface 10a of the wafer 10W. Subsequently, similar to Step S3 (refer to (b) in FIG. 4) of the first embodiment, the rear surface 10b of the wafer 10W is polished (Step S23).

Figure 12:
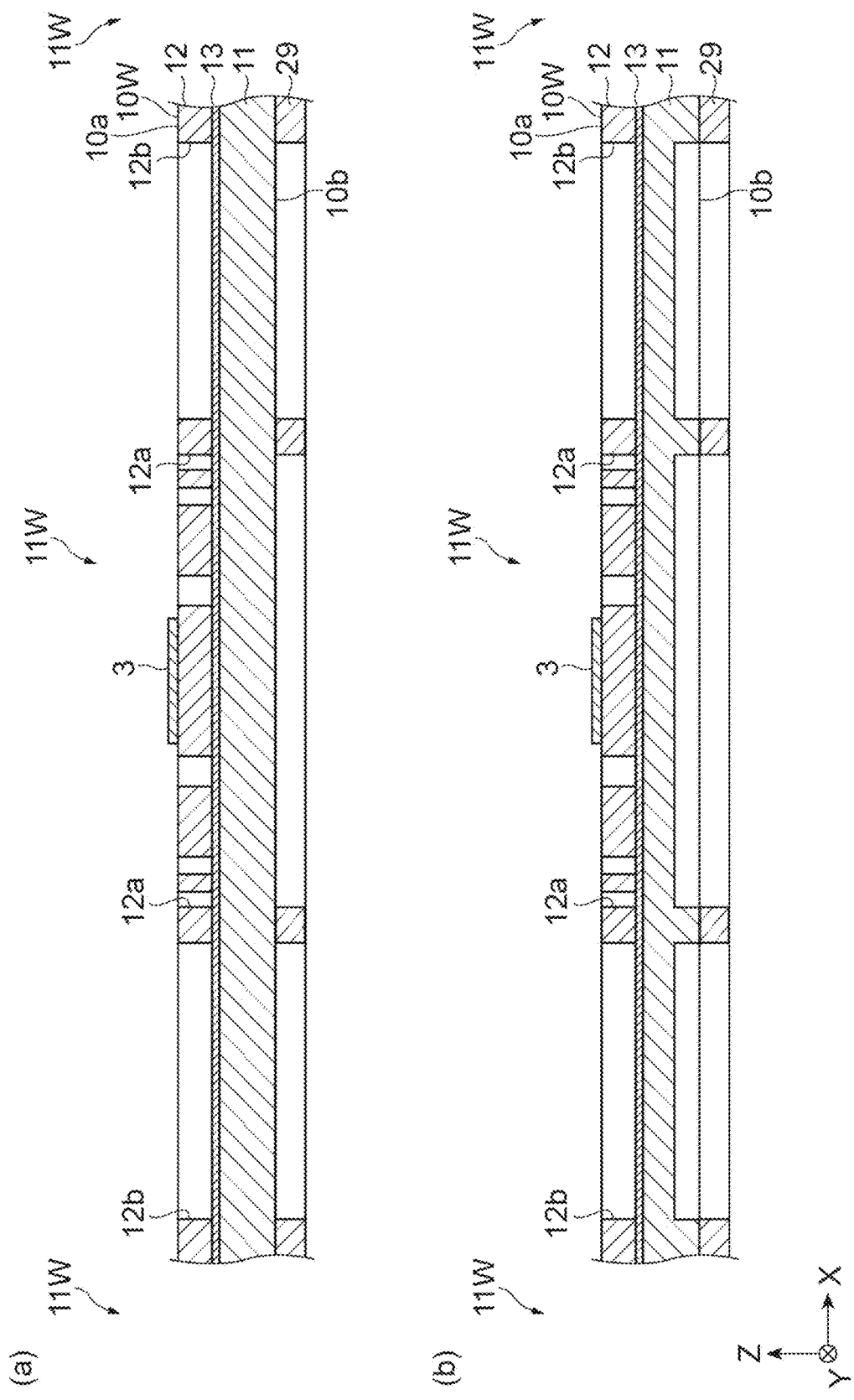
FIG. 12 is a cross-sectional view for describing the method for manufacturing the mirror device illustrated in FIG. 10.

Subsequently, as illustrated in (a) in FIG. 12, similar to Step S4 of the first embodiment, a patterning member 29 is patterned on the rear surface 10b of the wafer 10W (Step S24). Subsequently, as illustrated in (b) in FIG. 12, a part of the support layer 11 is removed from the wafer 10W by etching via the patterning member 29 (Step S25). In Step S25, only a part of the support layer 11 in the thickness direction is removed. Step S25 is otherwise similar to Step S5 of the first embodiment. Subsequently, similar to Step S6 (refer to FIG. 6) of the first embodiment, patterning member removal and protective film removal are performed (Step S26). After the patterning member removal is performed, the patterning member 29 is removed from the wafer 10W, as illustrated in (a) in FIG. 13.

Figure 13:
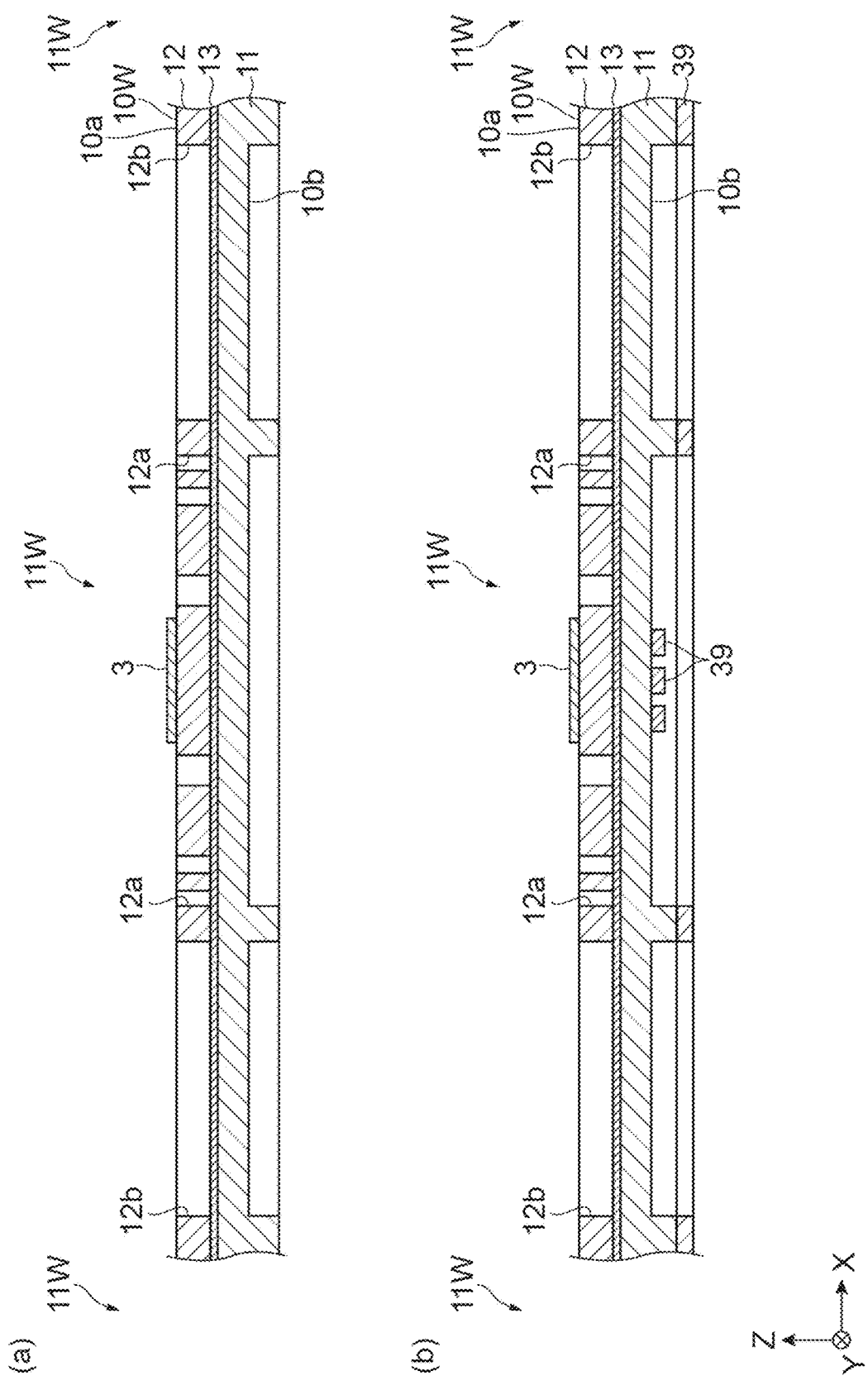
FIG. 13 is a cross-sectional view for describing the method for manufacturing the mirror device illustrated in FIG. 10.
Figure 14:
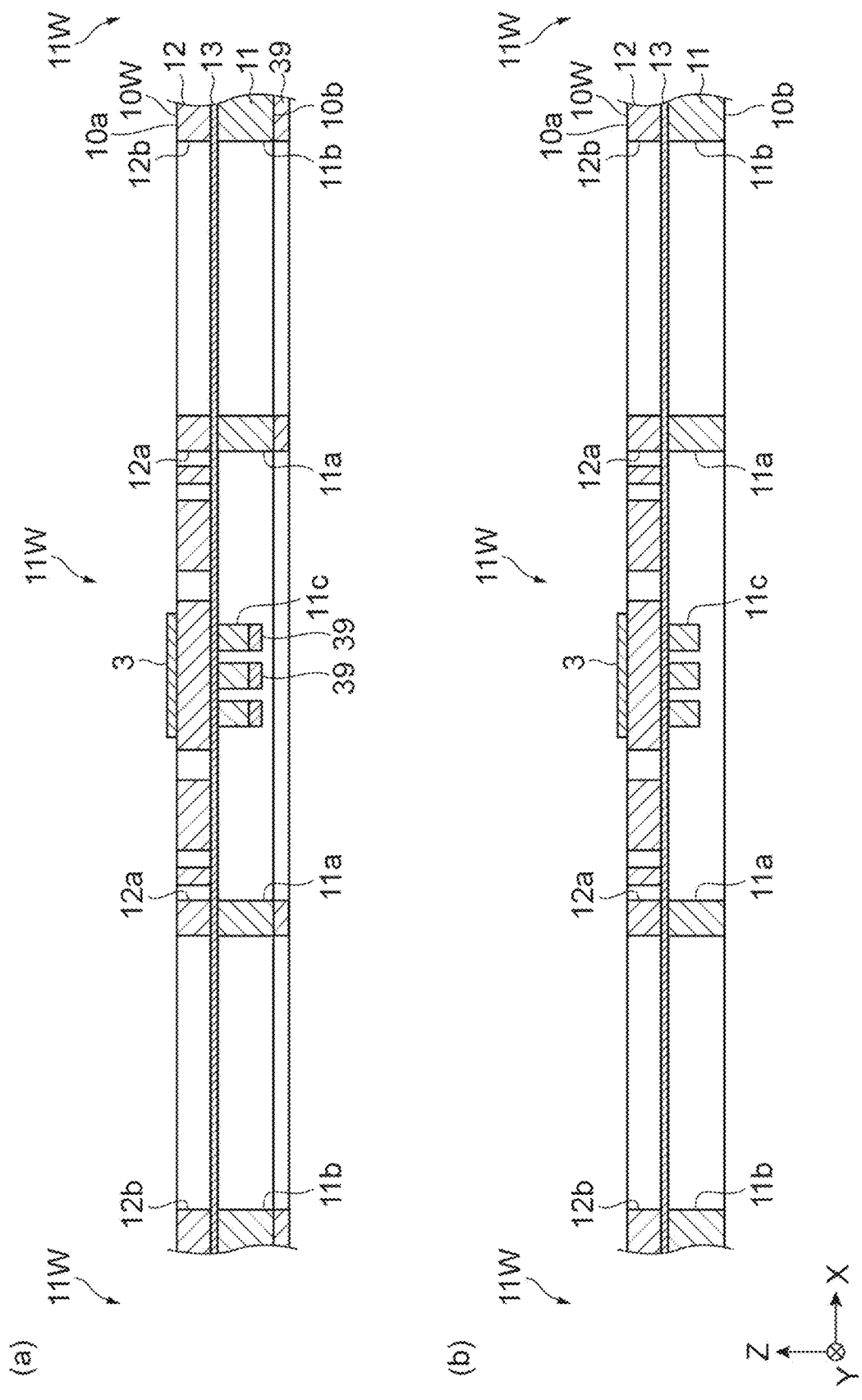
FIG. 14 is a cross-sectional view for describing the method for manufacturing the mirror device illustrated in FIG. 10.

Subsequently, as illustrated in (b) in FIG. 13, a patterning member 39 is patterned on the rear surface 10b of the wafer 10W (Step S27). Specifically, the patterning member 39 is provided in a region corresponding to the base portion 21 on the rear surface 10b, that is, a region excluding the region corresponding to the circulation holes 21b and a region corresponding to the beam portion 5 on the rear surface 10b. Subsequently, as illustrated in (a) in FIG. 14, a part of the support layer 11 is removed from the wafer 10W by etching via the patterning member 39 (Step S28). Specifically, a part on a side inward from a part corresponding to the base portion 21 in the support layer 11, that is, parts excluding parts corresponding to the beam portions 5 and parts corresponding to the circulation holes 21b are removed. As a result, the end surface 11c of the support layer 11 is formed.

Subsequently, the patterning member removal is performed again (Step S29). After the patterning member removal is performed again, the patterning member 39 is removed from the wafer 10W, as illustrated in (b) in FIG. 14. Subsequently, as illustrated in (a) in FIG. 15, a part of the intermediate layer 13 is removed from the wafer 10W by etching (Step S30). Specifically, a part on a side inward from a part corresponding to the base portion 21 in the intermediate layer 13, that is, parts excluding parts corresponding to the beam portions 5 and parts corresponding to the circulation holes 21b are removed. As a result, the end surface 13c of the intermediate layer 13 is formed. In Step S30, etching is performed such that the end surface 13c of the intermediate layer 13 is not recessed with respect to the end surface 11c of the support layer 11. In Step S30, etching is performed such that the end surface 13c of the intermediate layer 13 is flush with the end surface 11c of the support layer 11. Subsequently, similar to Step S8 (refer to FIG. 8) of the first embodiment, the wet cleaning is performed (Step S31, the third step). Subsequently, as illustrated in (b) in FIG. 15, each of the plurality of parts 12WB is cut out from the wafer 10W (Step S32, the fourth step). Accordingly, a plurality of mirror devices 1B are manufactured.

As described above, according to the method for manufacturing the mirror device 1B, similar to the method for manufacturing the mirror device 1A of the first embodiment described above, occurrence of damage to the mirror device 1B and a foreign substance remaining can be curbed.

In addition, in the method for manufacturing the mirror device 1B, in Step S30 (second step), etching is performed such that the end surface 13c of the intermediate layer 13 is not recessed with respect to the end surface 11c of the support layer 11. For this reason, the beam portions 5 are unlikely to peel from the first movable portion 22. If the end surface 13c of the intermediate layer 13 is recessed with respect to the end surface 11c of the support layer 11, the beam portions 5 peel from the first movable portion 22. As a result, there is concern that the structure 2B may break. Here, since the beam portions 5 are unlikely to peel from the first movable portion 22, breakage of the structure 2B is curbed. After Step S30, since the wet cleaning is performed in Step S31, it is particularly important that the beam portions 5 be unlikely to peel from the first movable portion 22.

Third Embodiment

Figure 16:
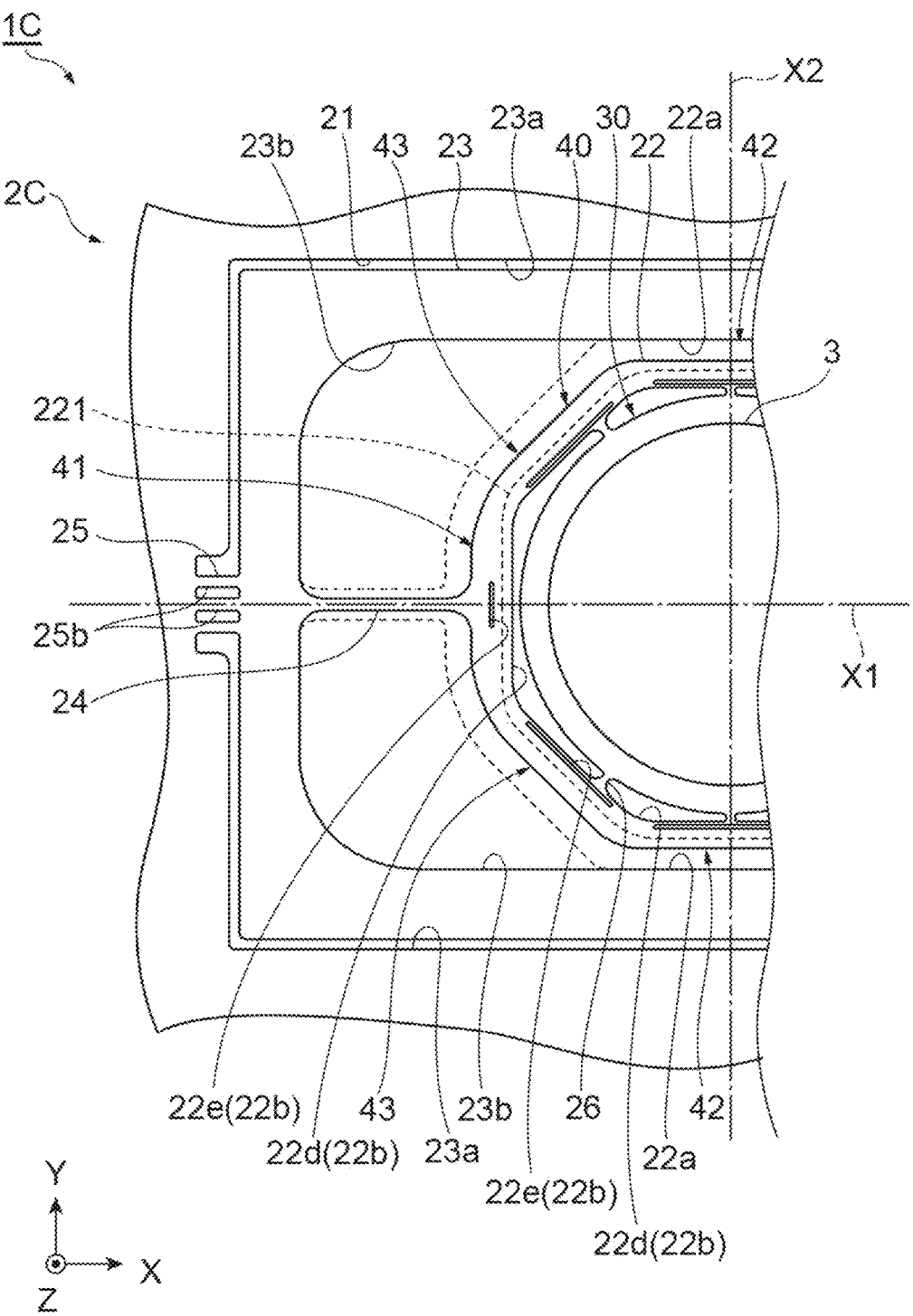
FIG. 16 is a plan view of a mirror device of a third embodiment.

As illustrated in FIG. 16, a mirror device 1C of a third embodiment mainly differs from the mirror device 1A of the first embodiment in that the circulation holes 22b include a first circulation region 22d and second circulation regions 22e, the circulation holes 23b communicate with the first slit 22a, and circulation holes 25b are formed in the second coupling portions 25. Detailed description of parts of the mirror device 1C similar to those of the mirror device 1A will be omitted.

The first movable portion 22 of a structure 2C exhibits an N-polygonal shape (N is a natural number of 4 or larger), for example, when viewed in the Z axis direction. N is preferably a natural number of 5 or larger. The first movable portion 22 exhibits an octagonal shape, for example, when viewed in the Z axis direction. The first movable portion 22 may exhibit a circular shape, for example, when viewed in the Z axis direction. The second coupling portions 25 are disposed on both sides of the second movable portion 23 in the X axis direction.

The circulation holes 22b formed in the first movable portion 22 include the first circulation region 22d and a plurality of second circulation regions 22e. The first circulation region 22d extends along the outer edge of the first movable portion 22 when viewed in the Z axis direction. The first circulation region 22d exhibits a ring shape, for example, when viewed in the Z axis direction. A plurality of connection portions 26 straddling the first circulation region 22d therebetween are formed in the first movable portion 22. Accordingly, the first circulation region 22d are divided into a plurality of regions arranged along the outer edge of the first movable portion 22. The connection portions 26 are arranged in a circumferential direction of the first circulation region 22d when viewed in the Z axis direction.

The plurality of second circulation regions 22e are positioned on the outward side of the first circulation region 22d when viewed in the Z axis direction. The plurality of second circulation regions 22e are arranged along the outer edge of the first movable portion 22 when viewed in the Z axis direction. Each of the second circulation regions 22e extends along the outer edge of the first movable portion 22 (each side of an octagon) when viewed in the Z axis direction. In this manner, the first circulation region 22d and the second circulation regions 22e are adjacent to each other in a direction perpendicular to the Z axis direction.

A direction perpendicular to the Z axis direction denotes a direction in a direction toward the outward side of the first circulation region from the inward side of the first circulation region when viewed in the Z axis direction. A direction perpendicular to the Z axis direction is a direction perpendicular to the outer edge of the first movable portion 22 when viewed in the Z axis direction. A direction perpendicular to the Z axis direction is a radial direction of the first movable portion 22 when viewed in the Z axis direction. Hereinafter, a direction perpendicular to the Z axis direction will be referred to as "a radial direction".

When viewed in the Z axis direction, the widths of the second circulation regions 22e in the radial direction are smaller than the width of the first circulation region 22d in the radial direction. The second circulation regions 22e may include a part of which the width in the radial direction is smaller than the width of the first circulation region 22d in the radial direction. In other words, the second circulation regions 22e may include a part of which the width in the radial direction is equal to or larger than the width of the first circulation region 22d in the radial direction.

The circulation holes (auxiliary circulation regions) 23b formed in the second movable portion 23 communicate with the first slit 22a. Specifically, the circulation holes 23b are formed due to a part of the first slit 22a expanding toward a side opposite to the first movable portion 22 in the X axis direction. The region constituted of the first slit 22a and the circulation holes 23b has a rectangular external shape, for example, when viewed in the Z axis direction. In FIG. 16, a boundary line between the circulation holes 23b and the first slit 22a is indicated by a dotted line. A pair of circulation holes 25b are formed in each of the second coupling portions 25. In each of the second coupling portions 25, the pair of circulation holes 25b are arranged in the Y axis direction. Each of the circulation holes 25b penetrates the second coupling portion 25.

Figure 17:
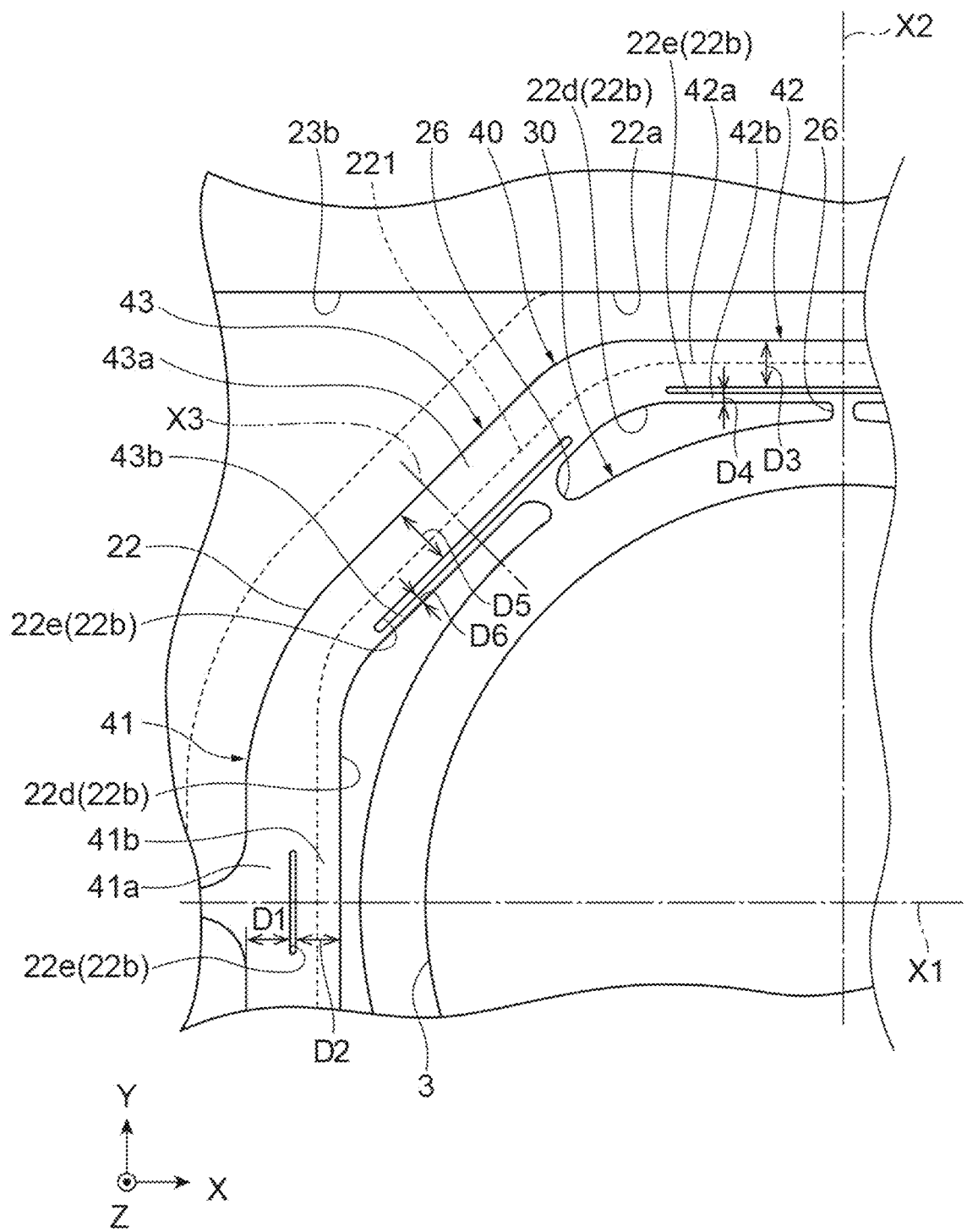
FIG. 17 is an enlarged view of the mirror device illustrated in FIG. 16.

As illustrated in FIGS. 16 and 17, a part on the inward side of first circulation region 22d in the first movable portion 22 constitutes a main body portion 30. A part on the outward side of the first circulation region 22d in the first movable portion 22 constitutes a ring-shaped portion 40. The main body portion 30 exhibits a circular shape in a plan view, but it may be formed to have an arbitrary shape such as an oval shape, a quadrangular shape, or a rhombic shape. The center of the main body portion 30 in a plan view coincides with the intersection between the first axis X1 and the second axis X2. The ring-shaped portion 40 is formed to have a ring shape such that the main body portion 30 is surrounded via the first circulation region 22d in a plan view. For example, the ring-shaped portion 40 has an outer edge and an inner edge having an octagonal shape in a plan view. The plurality of connection portions 26 couple the main body portion 30 and the ring-shaped portion 40 to each other.

The ring-shaped portion 40 has a pair of first parts 41, a pair of second parts 42, and two pairs of third parts (inclined portions) 43. The pair of first parts 41 are positioned on the both sides of the main body portion 30 in X axis direction. Each of the first parts 41 extends in the Y axis direction. The pair of second parts 42 are positioned on both sides of the main body portion 30 in the Y axis direction. Each of the second parts 42 extends in the X axis direction. Each of the two pairs of third parts 43 is positioned between the first parts 41 and the second parts 42 and is connected to the first parts 41 and the second parts 42. Each of the third parts 43 extends in a direction intersecting the X axis direction and the Y axis direction. Each of the third parts 43 obliquely intersects the center lines (first axis X1) of the first coupling portions 24 and the second coupling portions 25.

According to the constitution in which each of the third parts 43 extends in a direction intersecting the X axis direction and the Y axis direction, compared to when the ring-shaped portion 40 exhibits a rectangular ring shape, for example, each of the third parts 43 can be brought closer to the first axis X1. For this reason, the moment of inertia of the first movable portion 22 around the first axis X1 can be reduced by concentrating the mass of the first movable portion 22 in a region close to the first axis X1. In other words, when the first movable portion 22 exhibits an N-polygonal shape when viewed in the Z axis direction, as N becomes larger, the moment of inertia of the first movable portion 22 around the first axis X1 can be reduced by concentrating the mass of the first movable portion 22 in a region close to the first axis X1. Accordingly, driving power for driving the first movable portion 22 can be reduced.

The second circulation regions 22e are respectively formed in the first parts 41. Each of the first parts 41 has a first frame portion 41a on a side opposite to the main body portion 30 with respect to the second circulation regions 22e, and a second frame portion 41b on a side opposite to the first frame portion 41a with respect to the second circulation regions 22e. The first frame portion 41a is a part on the outward side of the second circulation regions 22e in the first movable portion 22. The second frame portion 41b is a part between the first circulation region 22d and the second circulation regions 22e in the first movable portion 22. The first frame portion 41a and the second frame portion 41b extend along the second circulation regions 22e. A width D1 of the first frame portion 41a in the radial direction is substantially the same as a width D2 of the second frame portion 41b in the radial direction.

In each of the first parts 41, the second circulation region 22e is disposed in a line-symmetrical manner about the first axis X1. Namely, in each of the first parts 41, the second circulation region 22e is formed at a position adjacent to the first coupling portion 24 on the center line of the first coupling portion 24 and the second coupling portion 25. Accordingly, for example, when a stress occurs in the first coupling portions 24 or the second coupling portions 25, and when the stress is transferred to the first movable portion 22, parts in the vicinity of the second circulation regions 22e in the first parts 41 are locally distorted. As a result, transfer of the stress to the main body portion 30 of the first movable portion 22 is curbed. Accordingly, distortion or the like of the mirror layer 3 can be curbed.

The second circulation regions 22e are respectively formed in the second parts 42. Each of the second parts 42 has a first frame portion 42a on a side opposite to the main body portion 30 with respect to the second circulation region 22e, and a second frame portion 42b on a side opposite to the first frame portion 42a with respect to the second circulation region 22e. The first frame portion 42a is a part on the outward side of the second circulation region 22e in the first movable portion 22. The second frame portion 42b is a part between the first circulation region 22d and the second circulation region 22e in the first movable portion 22. The first frame portion 42a and the second frame portion 42b extend along the second circulation region 22e. A width D3 of the first frame portion 42a in the radial direction is larger than a width D4 of the second frame portion 42b in the radial direction. In each of the second parts 42, the second circulation region 22e is formed at a position away from the center lines of the first coupling portions 24 and the second coupling portions 25.

Each second frame portion 42b functions as a stress relaxation region. Specifically, for example, when the first movable portion 22 receives a stress from the outside, the second frame portion 42b is locally distorted. As a result, transfer of the stress to the main body portion 30 of the first movable portion 22 is curbed. Accordingly, distortion or the like of the mirror layer 3 can be curbed.

Each of the second parts 42 is coupled to the main body portion 30 by the connection portion 26. Specifically, the connection portion 26 couples the second frame portion 42b and the main body portion 30 to each other. In each of the second parts 42, the connection portion 26 straddles the first circulation region 22d therebetween in the radial direction (a direction in which the first circulation region 22d and the second circulation region 22e are arranged). In each of the second parts 42, the connection portion 26 straddles a part of the first circulation region 22d overlapping the second circulation region 22e in the radial direction. The connection portion 26 coupling the second part 42 and the main body portion 30 to each other is formed in the first circulation region 22d on a side opposite to the first coupling portion 24 with respect to the third part 43.

In each of the second parts 42, the connection portion 26 is adjacent to the second circulation region 22e in the radial direction. Namely, the connection portion 26 is formed in a manner corresponding to the second circulation region 22e. In each of the second parts 42, the connection portion 26 is coupled to the second frame portion 42b substantially at a central position of the second circulation region 22e in the X axis direction. Accordingly, the second frame portion 42b can be uniformly disposed on both sides of the connection portion 26 in the X axis direction. For this reason, transfer of a stress to the main body portion 30 of the first movable portion 22 can be efficiently curbed.

The second circulation regions 22e are respectively formed in the third parts 43. Each of the third parts 43 has a first frame portion 43a on a side opposite to the main body portion 30 with respect to the second circulation region 22e, and a second frame portion 43b on a side opposite to the first frame portion 43a with respect to the second circulation region 22e. The first frame portion 43a is a part on the outward side of the second circulation region 22e in the first movable portion 22. The second frame portion 43b is a part between the first circulation region 22d and the second circulation region 22e in the first movable portion 22. The first frame portion 43a and the second frame portion 43b extend along the second circulation region 22e. A width D5 of the first frame portion 43a in the radial direction is larger than a width D6 of the second frame portion 43b in the radial direction.

Each second frame portion 43b functions as a stress relaxation region. Specifically, for example, when the first movable portion 22 receives a stress from the outside, the second frame portion 43b is locally distorted. As a result, transfer of the stress to the main body portion 30 of the first movable portion 22 is curbed. Accordingly, distortion or the like of the mirror layer 3 can be curbed.

Each of the third parts 43 is coupled to the main body portion 30 by the connection portion 26. Specifically, the connection portion 26 couples the second frame portion 43b and the main body portion 30 to each other. In each of the third parts 43, the connection portion 26 straddles the first circulation region 22d therebetween in the radial direction (a direction in which the first circulation region 22d and the second circulation region 22e are arranged). In each of the third parts 43, the connection portion 26 straddles a part of the first circulation region 22d overlapping the second circulation region 22e in the radial direction. The connection portion 26 coupling the third part 43 and the main body portion 30 to each other is formed in the first circulation region 22d between the first coupling portion 24 and the connection portion 26 coupling the second part 42 and the main body portion 30 to each other. The connection portion 26 coupling the third part 43 and the main body portion 30 to each other is formed at a part overlapping the third part 43 of the first circulation region 22d.

In each of the third parts 43, the connection portion 26 is adjacent to the second circulation region 22e in the radial direction. Namely, the connection portion 26 is formed in a manner corresponding to the second circulation region 22e. In each of the third parts 43, the connection portion 26 is coupled to the second frame portion 43b at a position on a side opposite to the first coupling portion 24 with respect to center lines X3 of the second circulation region 22e. In each of the third parts 43, the connection portion 26 is formed at a part on a side opposite to the first coupling portion 24 at a part of the first circulation region 22d overlapping the second circulation region 22e in the radial direction. Namely, in each of the third parts 43, the connection portion 26 is coupled to the second frame portion 43b at a position away from the first coupling portion 24. Accordingly, in each of the third parts 43, a distance from an end of the second frame portion 43b on the first coupling portion 24 side (an end close to the first coupling portion 24) to the connection portion 26 becomes long. Namely, in the second frame portion 43b, a region in which a stress transferred from the first coupling portion 24 is relaxed becomes long. For this reason, for example, transfer of a stress transferred from the first coupling portions 24 to the main body portion 30 of the first movable portion 22 via the connection portions 26 is effectively curbed. Accordingly, distortion or the like of the mirror layer 3 can be effectively curbed. The center lines X3 are lines passing through the centers of the second circulation regions 22e in an extending direction in the third parts 43 and extending in the radial direction.

The connection portion 26 may not be formed at a part of the first circulation region 22d overlapping the third part 43. The connection portion 26 may be formed at a part of the first circulation region 22d on the first coupling portion 24 side from the third part 43.

When the first movable portion 22 exhibits an N-polygonal shape viewed in the Z axis direction, as N becomes larger (for example, when N is 8), compared to when the first movable portion 22 exhibits a rectangular shape, for example, a distance between a pair of connection portions 26 coupling each of the second parts 42 and the main body portion 30 to each other and the first coupling portions 24 (a distance along the outer edge of the first movable portion 22) becomes short. As a result, there is concern that a stress transferred from the first coupling portions 24 to the main body portion 30 via the pair of connection portions 26 may increase. For this reason, it is preferable to curb transfer of a stress to the main body portion 30 by providing the connection portions 26 not only between the pair of connection portions 26 but also between the connection portions 26 and the first coupling portions 24 as described above. In addition, it is particularly preferable to provide the connection portions 26 between the third parts 43 different from the second parts 42 and the main body portion 30. Since each of the connection portions 26 couples each of the second parts 42 and the third parts 43 to the main body portion 30, a stress transferred from the first coupling portions 24 to the main body portion 30 can be further reduced. In the present embodiment, as described above, the pair of second parts 42 and the two pairs of third parts 43 are coupled to the main body portion 30 by three pairs of connection portions 26.

The first coil 221 of the mirror device 1C extends in a spiral shape on a side outward from the first circulation region 22d (the outer edge portion of the first movable portion 22) when viewed in the Z axis direction. Specifically, the first coil 221 is disposed between the first circulation region 22d and the second circulation region 22e (between the first circulation region 22d and the second circulation region 22e present on the first axis X1) in each of the first parts 41 and is disposed on a side outward from the second circulation region 22e (between the second circulation region 22e and the outer edge of the first movable portion 22 provided in a manner corresponding to the connection portion 26) in each of the second parts 42 and each of the third parts 43. Namely, the first coil 221 is provided in the second frame portion 41b in each of the first parts 41 and is provided in the first frame portion 42a and the first frame portion 43a in each of the second parts 42 and each of the third parts 43. For example, the first coil 221 is a drive coil and/or a sensing coil.

If the first coil 221 is disposed in the second frame portion 41b in each of the first parts 41, the first frame portion 41a is present between the first coupling portion 24 and the first coil 221. Therefore, for example, transfer of a stress which has occurred in the first coupling portions 24 or the second coupling portions 25 to the first coil 221 is curbed. Accordingly, damage to the first coil 221 can be prevented. In addition, if the first coil 221 is disposed in the first frame portion 42a and the first frame portion 43a in each of the second parts 42 and each of the third parts 43, the second frame portion 42b and the second frame portion 43b functioning as the stress relaxation regions which are relatively easily distorted can be avoided, and thus damage to the first coil 221 can be prevented. In addition, if the first coil 221 is disposed in the first frame portion 42a and the first frame portion 43a in each of the second parts 42 and each of the third parts 43, the width D4 of the second frame portion 42b in the radial direction and the width D6 of the second frame portion 43b in the radial direction can be sufficiently reduced, and thus the functions of the second frame portion 42b and the second frame portion 43b as the stress relaxation regions can be sufficiently exhibited.

Next, a method for manufacturing the mirror device 1C will be described. The method for manufacturing the mirror device 1C mainly differs from the method for manufacturing the mirror device 1A of the first embodiment in that the circulation holes 22b including the first circulation region 22d and the second circulation regions 22e are formed, the circulation holes 23b communicating with the first slit 22a is formed, and the circulation holes 25b are formed in the second coupling portions 25. Detailed description of parts of the method for manufacturing the mirror device 1C similar to those of the method for manufacturing the mirror device 1A will be omitted.

In the method for manufacturing the mirror device 1C, in the second step, parts in the device layer corresponding to the first slit 22a and the second slit 23a, a region excluding the connection portions 26 in the first circulation region 22d, the second circulation regions 22e, the circulation holes 23b, and the circulation holes 25b are removed. In addition, in the method for manufacturing the mirror device 1C, in the second step, a part on a side inward from a part corresponding to the base portion 21 in the intermediate layer is removed. As a result, the first slit 22a and the second slit 23a are formed, and the plurality of first movable portions 22 and the plurality of second movable portions 23 are released.

In addition, in the method for manufacturing the mirror device 1C, in the second step, as described above, the plurality of circulation holes 22b, 23b, and 25b penetrating the wafer are formed at parts other than the first slit 22a and the second slit 23a in the wafer by removing a part of the intermediate layer 13 from the wafer. Specifically, in the method for manufacturing the mirror device 1C, in the second step, the circulation holes 22b penetrating the wafer are formed at parts corresponding to the first movable portions 22 in the wafer, the circulation holes 23b penetrating the wafer are formed at parts corresponding to the second movable portion 23, and the circulation hole 25b penetrating the wafer are formed at parts corresponding to the second coupling portions 25.

Specifically, in the method for manufacturing the mirror device 1C, in the second step, the circulation holes 23b are formed such that the circulation holes 23b communicate with the first slit 22a. In addition, in the method for manufacturing the mirror device 1C, in the second step, when viewed in the Z axis direction, the circulation holes 22b are formed at parts corresponding to the first movable portions 22 such that the circulation holes 22b include the first circulation region 22d and the second circulation regions 22e which are adjacent to each other in the radial direction. In addition, in the method for manufacturing the mirror device 1C, in the second step, when viewed in the Z axis direction, the circulation holes 22b are formed such that the connection portions 26 straddling the first circulation region 22d therebetween are formed in the radial direction. In addition, in the method for manufacturing the mirror device 1C, in the second step, when viewed in the Z axis direction, the circulation holes 22b are formed to include a part where the widths of the second circulation regions 22e in the radial direction is smaller than the width of the first circulation region 22d in the radial direction.

In addition, in the method for manufacturing the mirror device 1C, in the second step, the first slit 22a is formed such that the first movable portion 22 is supported on the base portion 21 by the first coupling portions 24. In addition, in the method for manufacturing the mirror device 1C, in the second step, when viewed in the Z axis direction, the second circulation regions 22e are formed such that the second circulation regions 22e are adjacent to the first coupling portions 24 in the radial direction. In addition, in the method for manufacturing the mirror device 1C, in the second step, the second slit 23a is formed such that the second movable portion 23 is supported on the base portion 21 by the second coupling portions 25. In addition, in the method for manufacturing the mirror device 1C, in the second step, the circulation holes 25b are formed at parts corresponding to the second coupling portions 25.

As described above, according to the method for manufacturing the mirror device 1C, similar to the method for manufacturing the mirror device 1A of the first embodiment described above, occurrence of damage to the mirror device 1C and a foreign substance remaining can be curbed.

In addition, in the method for manufacturing the mirror device 1C, in Step S7, the first slit 22a and the second slit 23a are formed such that the first movable portion 22 and the second movable portion 23 are respectively supported on the base portion 21 by the first coupling portions 24 and the second coupling portions 25 and the circulation holes 25b are formed at parts corresponding to the second coupling portions 25. Accordingly, during the wet cleaning in Step S7, a turbulent flow of the cleaning liquid is likely to be generated in the vicinity of the second coupling portions 25. Therefore, while the intensity of the second coupling portions 25 is maintained, a foreign substance can be reliably removed from parts corresponding to the second coupling portions 25.

In addition, in the method for manufacturing the mirror device 1C, in Step S7, the circulation holes 23b are formed such that the circulation holes 23b communicate with the first slit 22a. Accordingly, during the wet cleaning in Step S7, a larger amount of cleaning liquid can be circulated via the circulation holes 23b.

In addition, in the method for manufacturing the mirror device 1C, in Step S7, the circulation holes 22b are formed at a part corresponding to the first movable portion 22 such that the circulation holes 22b include the first circulation region 22d and the second circulation region 22e adjacent to each other in the radial direction when viewed in the Z axis direction. Accordingly, during the wet cleaning in Step S8, a turbulent flow of the cleaning liquid is likely to be generated at a place where the first circulation region 22d and the second circulation region 22e are adjacent to each other. Therefore, a foreign substance can be reliably removed from the wafer 10W.

In addition, in the method for manufacturing the mirror device 1C, in Step S7, the circulation holes 22b are formed such that the connection portions 26 straddling the first circulation region 22d are formed in the radial direction when viewed in the Z axis direction. Accordingly, during the wet cleaning in Step S8, the wafer 10W is reinforced by the connection portions 26. Therefore, occurrence of damage to the wafer 10W can be curbed. In addition, during the wet cleaning in Step S8, the cleaning liquid can be circulated via the second circulation region 22e. Therefore, a load received by the connection portions 26 due to the cleaning liquid can be reduced, and occurrence of damage to the connection portions 26 can be curbed.

In addition, in the method for manufacturing the mirror device 1C, in Step S7, the circulation holes 22b are formed such that the second circulation region 22e includes a part where the width of the second circulation region 22e in the radial direction is smaller than the width of the first circulation region 22d in the radial direction when viewed in the Z axis direction. Accordingly, the width of the first circulation region 22d and the width of the second circulation region 22e differ from each other. Therefore, a turbulent flow of the cleaning liquid is likely to be generated during the wet cleaning in Step S8. For this reason, a foreign substance can be reliably removed from the wafer 10W.

In addition, in the method for manufacturing the mirror device 1C, in Step S7, the first slit 22a and the second slit 23a are formed such that the first movable portion 22 and the second movable portion 23 are respectively supported on the base portion 21 by the first coupling portions 24 and the second coupling portions 25, and the second circulation region 22e is formed such that the second circulation region 22e is adjacent to the first coupling portions 24 in a direction in which the first circulation region 22d and the second circulation region 22e are arranged when viewed in the Z axis direction. Accordingly, during the wet cleaning in Step S8, the cleaning liquid can be circulated via the second circulation region 22e. Therefore, a load received by the first coupling portions 24 due to the cleaning liquid can be reduced, and occurrence of damage to the first coupling portions 24 can be curbed.

Fourth Embodiment

Figure 18:
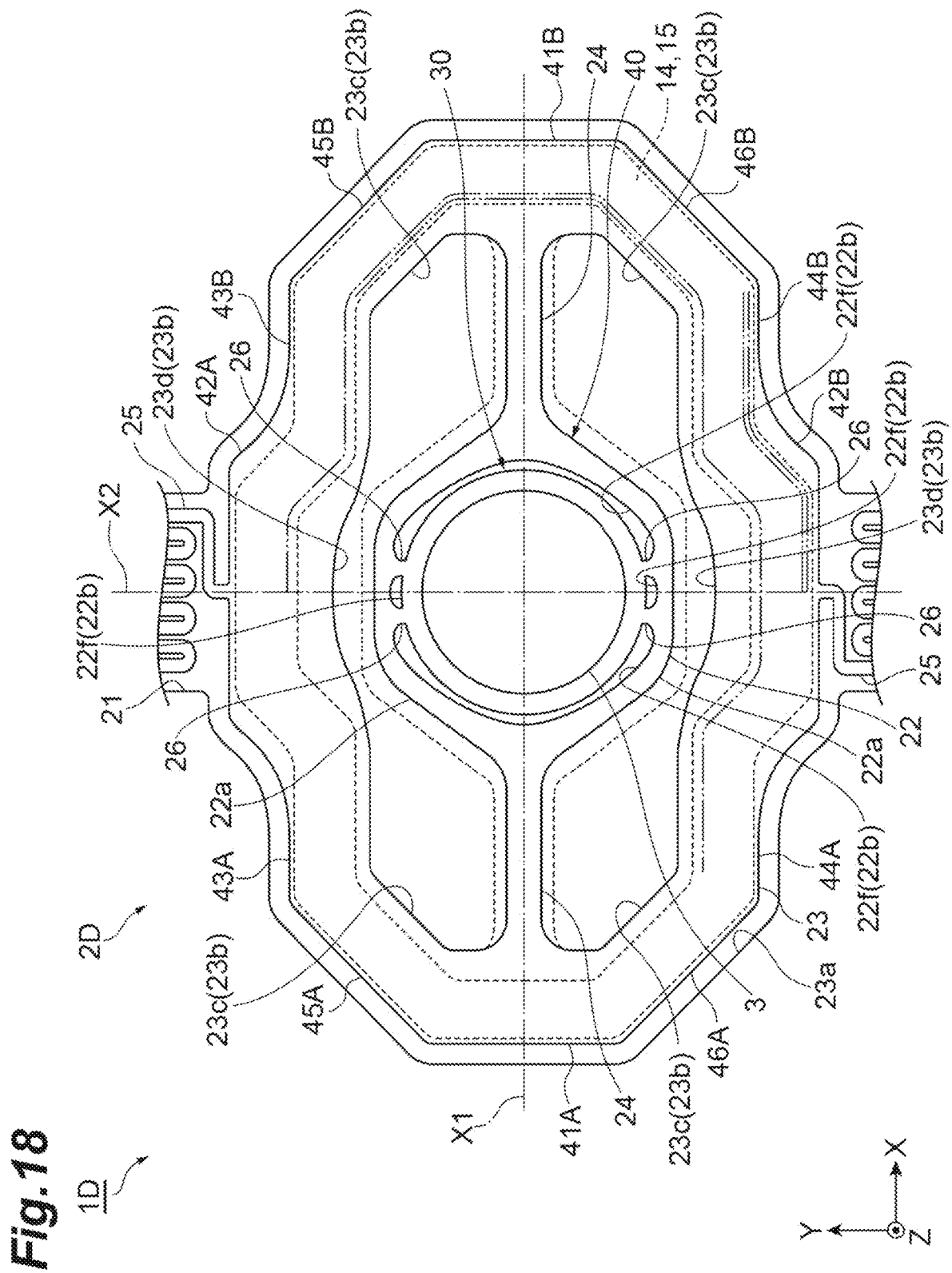
FIG. 18 is a plan view of a mirror device of a fourth embodiment.

As illustrated in FIG. 18, a mirror device 1D of a fourth embodiment mainly differs from the mirror device 1A of the first embodiment in that the circulation holes 22f are formed in the first movable portion 22, and the circulation holes 23b communicate with the first slit 22a. Detailed description of parts of the mirror device 1D similar to those of the mirror device 1A will be omitted.

The circulation holes 22f are formed in the first movable portion 22 of a structure 2D. The circulation holes 22f extend along the outer edge of the first movable portion 22 when viewed in the Z axis direction. The circulation holes 22f exhibit ring shapes, for example, when viewed in the Z axis direction. In the first movable portion 22, the plurality of connection portions 26 straddling the circulation holes 22f therebetween are formed. For example, in the first movable portion 22, four connection portions 26 are formed. The connection portions 26 are respectively formed on both end portions of the first movable portion 22 in the Y axis direction when viewed in the Z axis direction. Accordingly, the circulation holes 22b are divided into a plurality of regions.

A part on the inward side of the circulation hole 22f in the first movable portion 22 constitutes the main body portion 30. A part on the outward side of the circulation hole 22f in the first movable portion 22 constitutes the ring-shaped portion 40. The main body portion 30 exhibits a circular shape in a plan view, but it may be formed to have an arbitrary shape such as an oval shape, a quadrangular shape, or a rhombic shape. The center of the main body portion 30 in a plan view coincides with the intersection between the first axis X1 and the second axis X2. The ring-shaped portion 40 is formed to have a ring shape such that the main body portion 30 is surrounded via the circulation hole 22f in a plan view. The ring-shaped portion 40 has a hexagonal external shape in a plan view, but it may have an arbitrary external shape such as a circular shape, an oval shape, a quadrangular shape, or a rhombic shape. The main body portion 30 and the ring-shaped portion 40 are coupled to each other by the plurality of connection portions 26.

The second movable portion 23 of the mirror device 1D is formed to have a frame shape and is disposed on the inward side of the base portion 21 such that the first movable portion 22 is surrounded. The second movable portion 23 has a pair of first connection portions 41A and 41B, a pair of second connection portions 42A and 42B, a pair of first straight portions 43A and 43B, a pair of second straight portions 44A and 44B, a pair of third straight portions 45A and 45B, and a pair of fourth straight portions 46A and 46B. The second movable portion 23 has a symmetrical shape about each of the first axis X1 and the second axis X2 in a plan view. In the following description, a state of being symmetrical about the first axis X1 or the second axis X2 denotes a symmetrical state in a plan view.

The first connection portions 41A and 41B are positioned on both sides of the first movable portion 22 in the X axis direction. That is, each of the first connection portions 41A and 41B has a part facing the first movable portion 22 in the X axis direction in a plan view. Each of the first connection portions 41A and 41B extends in the Y axis direction.

The second connection portions 42A and 42B are positioned on both sides of the first movable portion 22 in the Y axis direction. That is, each of the second connection portions 42A and 42B has a part facing the first movable portion 22 in the Y axis direction in a plan view. Each of the second connection portions 42A and 42B extends in the X axis direction.

The first straight portions 43A and 43B are positioned on both sides of the second connection portion 42A in the X axis direction and are connected to the second connection portion 42A. Each of the first straight portions 43A and 43B extends in the X axis direction. The first straight portions 43A and 43B are disposed in a mutually symmetrical manner about the Y axis. The second straight portions 44A and 44B are positioned on both sides of the second connection portion 42B in the X axis direction and are connected to the second connection portion 42B. Each of the second straight portions 44A and 44B extends in the X axis direction. The second straight portions 44A and 44B are disposed in a mutually symmetrical manner about the Y axis.

The third straight portions 45A and 45B are positioned on a side opposite to the second connection portion 42A with respect to each of the first straight portions 43A and 43B and are connected to the first straight portions 43A and 43B and the first connection portions 41A and 41B. The third straight portion 45A extends in a direction inclined by 45 degrees with respect to each of the X axis and the Y axis in a plan view. The third straight portion 45B extends in a symmetrical manner about the Y axis with respect to the third straight portion 45A.

The fourth straight portions 46A and 46B are positioned on a side opposite to the second connection portion 42B with respect to each of the second straight portions 44A and 44B and are connected to the second straight portions 44A and 44B and the first connection portions 41A and 41B. The fourth straight portion 46A extends in a symmetrical manner about the X axis with respect to the third straight portion 45A. The fourth straight portion 46B extends in a symmetrical manner about the Y axis with respect to the fourth straight portion 46A and extends in a symmetrical manner about the X axis with respect to the third straight portion 45B.

Each of the first coupling portions 24 is connected to the second movable portion 23 in the first connection portions 41A and 41B. In the present embodiment, in order to relax a stress acting on the first coupling portions 24, the width of the end portion of each of the first coupling portions 24 on the first movable portion 22 side (the width in the Y axis direction) expands as it goes closer to the first movable portion 22, and the width of the end portion on the second movable portion 23 side (the width in the Y axis direction) expands as it goes closer to the second movable portion 23.

Each of the second coupling portions 25 is connected to the second movable portion 23 in the second connection portions 42A and 42B. Each of the second coupling portions 25 extends in a meandering manner in a plan view. Each of the second coupling portions 25 has a plurality of straight portions and a plurality of folded portions. The straight portions extend in the Y axis direction and are disposed in a manner of being arranged in the X axis direction. The folded portions alternately couple both ends of straight portions which are adjacent to each other.

The circulation holes (auxiliary circulation regions) 23b formed in the second movable portion 23 communicate with the first slit 22a. The circulation holes 23b include four first parts 23c and two second parts 23d. Each of the first parts 23c is disposed in a mutually line-symmetrical manner about the first axis X1 and the second axis X2 on the outward side of the first movable portion 22 when viewed in the Z axis direction. Each of the first parts 23c is formed due to a part of the first slit 22a expanding toward a side opposite to the first movable portion 22 in the X axis direction. Each of the second parts 23d is individually positioned between the pair of first parts 23c on both sides of the first movable portion 22 in the Y axis direction. Each of the second parts 23d is formed due to a part of the first slit 22a expanding to a side opposite to the first movable portion 22 in the Y axis direction. Each of the second parts 23d individually communicates with each of the first slits 22a. In FIG. 18, a boundary line between the circulation holes 23b and the first slit 22a is indicated by a dotted line. The mirror device 1D further includes a pair of coils 14 and 15.

Each of the coils 14 and 15 is provided in the second movable portion 23 such that the first movable portion 22 is surrounded and exhibits a spiral shape in a plan view (when viewed in a direction orthogonal to a plane where each of the coils 14 and 15 is disposed). Each of the coils 14 and 15 is disposed along a plane including the X axis and the Y axis. Each of the coils 14 and 15 is wound around the first movable portion 22 a plurality of times. The pair of coils 14 and 15 are disposed in a manner of being alternately arranged in a width direction of the second movable portion 23 in a plan view. No coil is provided in the first movable portion 22.

Next, a method for manufacturing the mirror device 1D will be described. The method for manufacturing the mirror device 1D mainly differs from the method for manufacturing the mirror device 1A of the first embodiment in that the circulation holes 22f are formed in the first movable portion 22 and the circulation holes 23b communicating with the first slit 22a are formed. Detailed description of parts of the method for manufacturing the mirror device 1D similar to those of the method for manufacturing the mirror device 1A will be omitted.

In the method for manufacturing the mirror device 1D, in the second step, parts corresponding to the first slit 22a, the second slit 23a, the circulation holes 22f, and the circulation holes 23b in the device layer are removed. In addition, in the method for manufacturing the mirror device 1D, in the second step, a part on a side inward from a part corresponding to the base portion 21 in the intermediate layer is removed. As a result, the first slit 22a and the second slit 23a are formed, and the plurality of first movable portions 22 and the plurality of second movable portions 23 are released.

In addition, in the method for manufacturing the mirror device 1D, in the second step, as described above, the plurality of circulation holes 22f and 23b penetrating the wafer are formed at parts other than the first slit 22a and the second slit 23a in the wafer by removing a part of the intermediate layer 13 from the wafer. Specifically, in the method for manufacturing the mirror device 1D, in the second step, the circulation holes 22f penetrating the wafer are formed at parts corresponding to the first movable portion 22 in the wafer, and the circulation holes 23b penetrating the wafer are formed at parts corresponding to the second movable portion 23 in the wafer.

As described above, according to the method for manufacturing the mirror device 1D, similar to the method for manufacturing the mirror device 1A of the first embodiment described above, occurrence of damage to the mirror device 1D and a foreign substance remaining can be curbed.

Modification Example

Hereinabove, the embodiments of the present disclosure have been described, but the present disclosure is not limited to the embodiments described above.

In each of the embodiments, an example in which a part of the device layer 12, a part of the support layer 11, and a part of the intermediate layer 13 are removed from the wafer 10W in this order has been described. However, the embodiments are not limited thereto. A part of the support layer 11, a part of the device layer 12, and a part of the intermediate layer 13 may be removed from the wafer 10W in this order. In this case, the patterning member removal and the protective film removal are performed before a part of the intermediate layer 13 is removed from the wafer 10W. In addition, a part of the support layer 11, a part of the intermediate layer 13, and a part of the device layer 12 may be removed from the wafer 10W in this order. In this case, the patterning member removal and the protective film removal are performed before a part of the device layer 12 is removed from the wafer 10W. Namely, in these cases, the first movable portion 22 and the second movable portion 23 may be released after the patterning member removal and the protective film removal.

In addition, in each of the embodiments, an example in which the patterning members 19, 29, and 39 are removed by the wet process in the patterning member removal has been described. However, the patterning members 19, 29, and 39 may be removed from the wafer 10W by a dry process in the patterning member removal. Similarly, in each of the embodiments, an example in which the protective film is removed by the wet process in the protective film removal has been described. However, the protective film may be removed from the wafer 10W by the dry process in the protective film removal. In these cases, a part of the device layer 12, a part of the intermediate layer 13, and a part of the support layer 11 may be removed from the wafer 10W in this order. Namely, in these cases, the patterning member removal and the protective film removal may be performed after the first movable portion 22 and the second movable portion 23 are released. In addition, in each of the embodiments, an example in which the protective film removal is performed after the patterning member removal is performed has been described. However, the patterning member removal may be performed after the protective film removal is performed.

In addition, in the first embodiment, an example in which the first slit 22a, the second slit 23a, and the circulation holes 21b, 22b, and 23b are formed by removing a part on a side inward from a part corresponding to the base portion 21 and parts corresponding to the circulation holes 21b in the intermediate layer 13 has been described. However, the embodiments are not limited thereto. The sequence of forming the first slit 22a, the second slit 23a, and the circulation holes 21b, 22b, and 23b may be arbitrary. For example, the circulation holes 21b, 22b, and 23b may be formed after the first slit 22a and the second slit 23a are formed, namely, after the first movable portion 22 and the second movable portion 23 are released. In this case, parts corresponding to the circulation holes 21b, 22b, and 23b may be removed after parts corresponding to the first slit 22a and the second slit 23a in the wafer 10W are removed first. In addition, the first slit 22a and the second slit 23a may be formed after the circulation holes 21b, 22b, and 23b are formed. In this case, parts corresponding to the first slit 22a and the second slit 23a may be removed after parts corresponding to the circulation holes 21b, 22b, and 23b in the wafer 10W are removed first.

In addition, in the first embodiment, an example in which the straightening layer 4 is formed on the rear surface 10b of the wafer 10W has been described. However, the straightening layer 4 may be formed on the front surface 10a of the wafer 10W. Specifically, in the base portion 21, the second movable portion 23, each of the first coupling portions 24, and each of the second coupling portions 25, the straightening layer 4 may be formed on a surface on a side opposite to the intermediate layer 13 in the device layer 12. In in the first movable portion 22, the straightening layer 4 may be formed on a surface on a side opposite to the intermediate layer 13 in the device layer 12 and a surface on a side opposite to the device layer 12 in the mirror layer 3. In addition, the straightening layer 4 may be formed on the front surface 10a and may be formed on the rear surface 10b. Namely, the straightening layer 4 is formed on the front surface 10a and/or the rear surface 10b.

Figure 19:
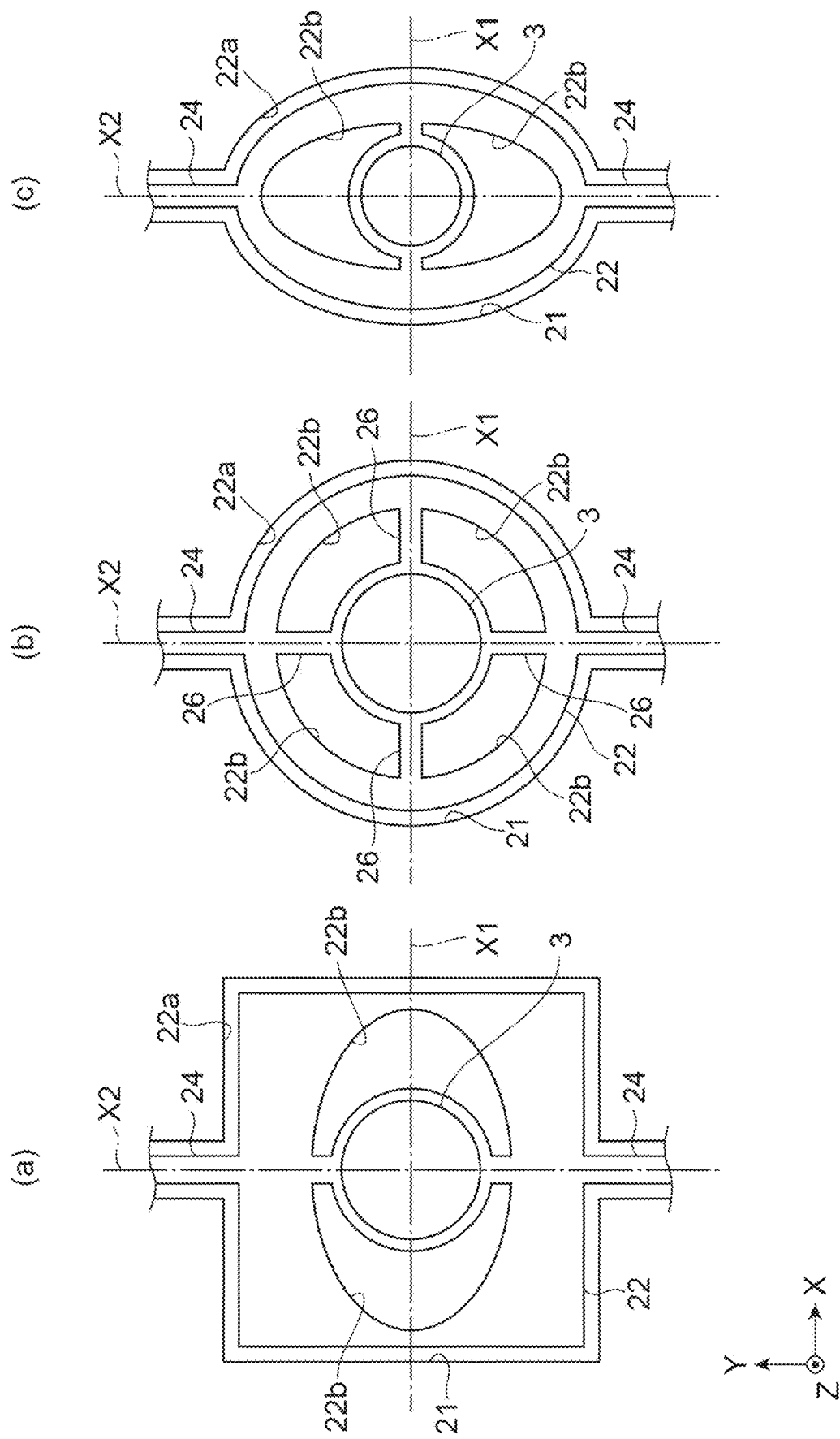
FIG. 19 is a plan view of a mirror device of a modification example.

In addition, as illustrated in (a) in FIG. 19, in each of the circulation holes 22b, the width in the X axis direction (a direction perpendicular to the thickness direction the wafer 10W) may vary when viewed in the Z axis direction. That is, the widths of the circulation holes 22b in the X axis direction may differ from each other at different positions in the Y axis direction when viewed in the Z axis direction. Specifically, in each of the circulation holes 22b, the width of the central portion in the Y axis direction may be larger than the widths of both end portions in the Y axis direction. In each of the circulation holes 22b, at least a part may include a curved portion when viewed in the Z axis direction. In each of the circulation holes 22b, one edge and the other edge in the X axis direction may exhibit different shapes when viewed in the Z axis direction. Each of the circulation holes 22b may exhibit a crescent shape surrounding the mirror layer 3 when viewed in the Z axis direction. In these cases, since a complicated water flow is likely to be generated in the vicinity of each of the circulation holes 22b during the wet cleaning in the third step, cleaning efficiency in the wet cleaning is improved.

In the second step of each of the embodiments, each of the circulation holes 22b may be formed such that the width in the X axis direction varies when viewed in the Z axis direction. Accordingly, during the wet cleaning in the third step, a turbulent flow of the cleaning liquid is likely to be generated. Therefore, a foreign substance can be reliably removed from the wafer 10W. In the second step of each of the embodiments, each of the circulation holes 22b may be formed such that curved portions are included in at least a part. Accordingly, during the wet cleaning in Step S8, a load due to the cleaning liquid received by the curved portions of the circulation holes 22b becomes small. Therefore, occurrence of damage to the mirror device 1A can be curbed. In the second step of each of the embodiments, each of the circulation holes 22b may be formed such that one edge and the other edge exhibit different shapes when viewed in the Z axis direction. Accordingly, larger circulation holes 22b are formed so that a larger amount of cleaning liquid can be circulated via the circulation holes 22b during the wet cleaning in the third step. For this reason, a foreign substance can be reliably removed from the wafer 10W. The structures 2A, 2B, 2C, and 2D may not have the second movable portion 23. In this case, the first movable portion 22 is disposed on the inward side of the base portion 21 via the first slit 22a when viewed in the Z axis direction. Each of the first coupling portions 24 may be individually disposed on both sides of the first movable portion 22 in the Y axis direction when viewed in the Z axis direction.

In addition, as illustrated in (b) in FIG. 19, the circulation holes 22b may exhibit a circular ring shape centering on the intersection between the first axis X1 and the second axis X2 when viewed in the Z axis direction. In this case, the connection portions 26 straddling the circulation holes 22b therebetween are formed in the first movable portion 22. For example, in the first movable portion 22, four connection portions 26 are formed. The connection portions 26 are arranged at equal intervals in the circumferential direction of the circulation holes 22b when viewed in the Z axis direction.

Accordingly, the circulation holes 22b are divided into a plurality of regions. The first movable portion 22 are point-symmetrical about the intersection between the first axis X1 and the second axis X2 when viewed in the Z axis direction. In this case, while the first movable portion 22 is appropriately reinforced by each of the connection portions 26, areas occupied by the circulation holes 22b in the first movable portion 22 can be increased. For this reason, during the wet cleaning in the third step, a larger amount of cleaning liquid can be circulated via the circulation holes 22b. Accordingly, a foreign substance can be reliably removed from the wafer 10W. In addition, since the first movable portion 22 is point-symmetrical, occurrence of damage to the first movable portion 22 can be curbed during the wet cleaning in the third step.

In addition, in the second step of each of the embodiments, the circulation hole 22b may be formed such that the connection portions 26 straddling the circulation hole 22b are formed. In the second step of each of the embodiments, circulation hole other than the circulation hole 22b may be formed such that coupling portion straddling circulation hole (for example, the circulation hole 23b) other than the circulation hole 22b is formed. Consequently, the wafer 10W is reinforced by the connection portions 26 during the wet cleaning in the third step. Therefore, occurrence of damage to the mirror device 1A can be curbed. The first movable portion 22 may exhibit a circular shape when viewed in the Z axis direction.

In addition, as illustrated in (c) in FIG. 19, the pair of circulation holes 22b may be mutually line-symmetrical about the first axis X1. Each of the circulation holes 22b may exhibit a crescent shape surrounding the mirror layer 3 when viewed in the Z axis direction. In this case, since a complicated water flow is likely to be generated in the vicinity of each of the circulation holes 22b during the wet cleaning in the third step, cleaning efficiency in the wet cleaning is improved. The first movable portion 22 may exhibit an oval shape in which the long axis extends in the Y axis direction when viewed in the Z axis direction.

Figure 20:
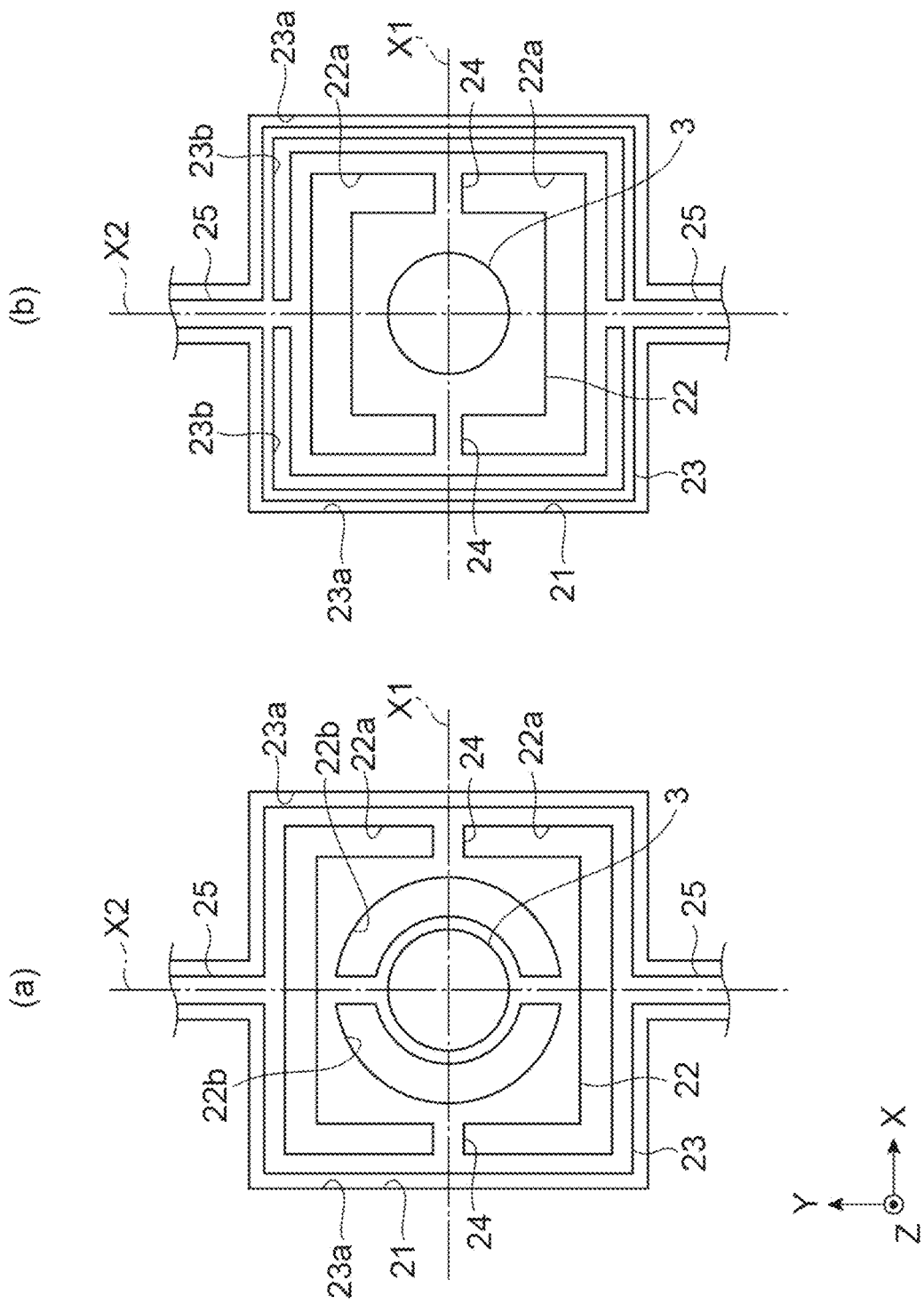
FIG. 20 is a plan view of a mirror device of a modification example.

In addition, as illustrated in (a) in FIG. 20, the circulation holes 23b may not be formed in the second movable portion 23. In addition, as illustrated in (b) in FIG. 20, the circulation holes 22b may not be formed in the first movable portion 22.

Figure 21:
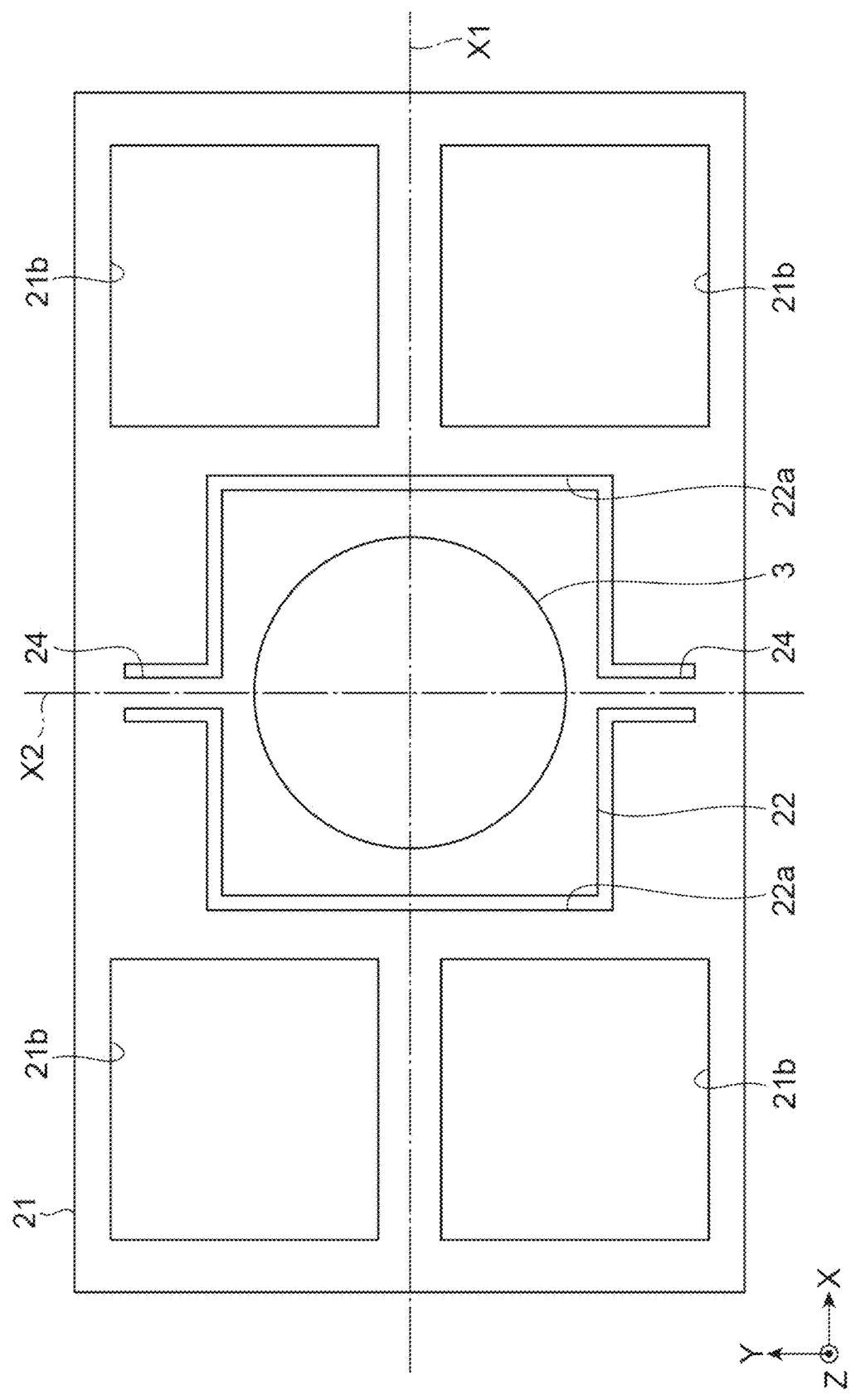
FIG. 21 is a plan view of a mirror device of a modification example.

In addition, as illustrated in FIG. 21, the circulation holes 22b and 23b may not be formed. Namely, the circulation holes 21b may be formed in only the base portion 21.

Figure 22:
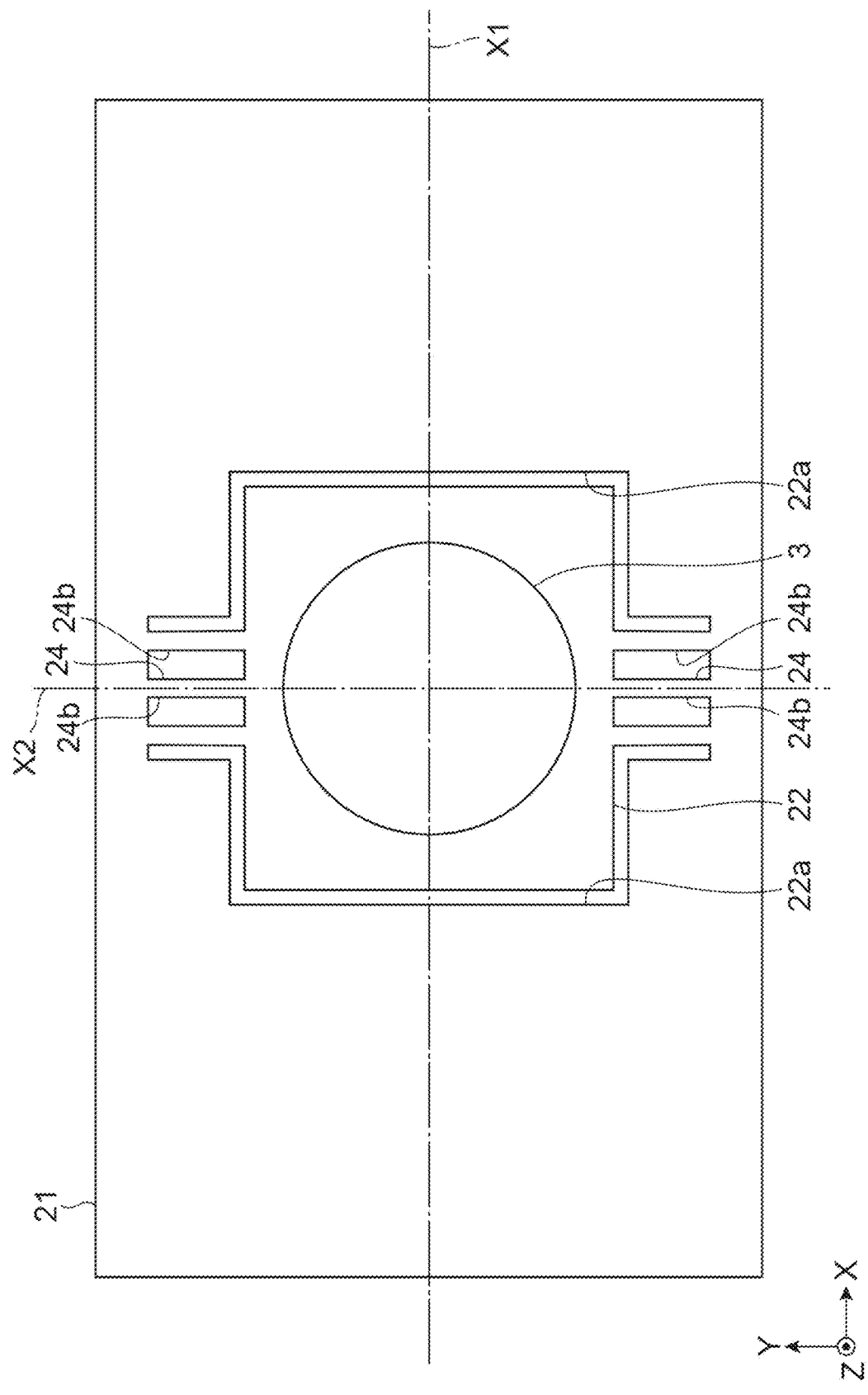
FIG. 22 is a plan view of a mirror device of a modification example.

In addition, as illustrated in FIG. 22, a pair of circulation holes 24b may be individually formed on both sides of each of the first coupling portions 24 in the X axis direction. Each of the circulation holes 24b penetrates the base portion 21. Each of the circulation holes 24b is positioned on a side inward from each of the first slits 22a in the X axis direction. In addition, the circulation holes 21b may not be formed in the base portion 21.

In addition, the circulation holes 21b, 22b, 23b, 24b, and 25b may not be formed to circulate the cleaning liquid. The circulation holes 21b, 22b, 23b, 24b, and 25b may be simple penetration holes or penetration regions.

The following inventions can be extracted from each of the foregoing embodiments.

Invention 1: an optical scanning device including a base portion, a movable portion supported on the base portion, a coupling portion coupled to the movable portion such that the movable portion becomes movable with respect to the base portion, and a mirror layer provided to the movable portion. A first penetration region exhibiting a ring shape and extending along an outer edge of the movable portion, a plurality of second penetration regions positioned on a side outward from the first penetration region, and connection portions straddling parts of the first penetration region overlapping the second penetration regions therebetween are formed in the movable portion. A width of a part on an outward side of the second penetration regions in the movable portion is larger than a width of a part between the first penetration region and the second penetration regions in the movable portion.

Invention 2: the optical scanning device according to the invention 1 in which the second penetration regions are formed at positions on a center line of the coupling portion.

Invention 3: the optical scanning device according to the invention 1 or 2 in which the connection portions are formed at parts on a side opposite to the coupling portion of the parts of the first penetration region overlapping the second penetration region.

Invention 4: the optical scanning device according to any one of the inventions 1 to 3 in which a part on the outward side of the first penetration region in the movable portion includes an inclined portion obliquely intersecting the center line of the coupling portion.

Invention 5: the optical scanning device according to any one of the inventions 1 to 4 in which the movable portion exhibits an N-polygonal shape (N is a natural number of 5 or larger).

Invention 6: the optical scanning device according to any one of the inventions 1 to 5 in which a part on the outward side of the first penetration region in the movable portion includes the inclined portion obliquely intersecting the center line of the coupling portion. The connection portions are formed in the first penetration region on a side opposite to the coupling portion with respect to the inclined portion. The connection portions are further formed in the first penetration region between the connection portions formed on a side opposite to the coupling portion with respect to the inclined portion and the coupling portion.

Invention 7: the optical scanning device according to the invention 6 in which the connection portions formed in the first penetration region between the connection portions formed on a side opposite to the coupling portion with respect to the inclined portion and the coupling portion are formed at parts overlapping the inclined portion in the first penetration region or parts on the coupling portion side from the inclined portion in the first penetration region.

Invention 8: the optical scanning device according to any one of the inventions 1 to 7 further includes a coil extending in an outer edge portion of the movable portion. The second penetration regions are formed at positions on the center line of the coupling portion and positions away from the center line of the coupling portion. The coil is disposed between the second penetration regions formed at positions on the center line of the coupling portion and the first penetration region and between the second penetration regions formed at positions away from the center line of the coupling portion and the outer edge of the movable portion.

REFERENCE SIGNS LIST 1A, 1B, 1C, 1D Mirror device
2A, 2B, 2C, 2D Structure
3 Mirror layer
4 Straightening layer
10W Wafer
10a Front surface
10b Rear surface
11 Support layer
12 Device layer
13 Intermediate layer
11a, 11b, 11c, 12a, 12b, 13a, 13b, 13c End surface
19 Patterning member
21 Base portion
22 First movable portion
22a First slit
23 Second movable portion
23a Second slit
21b, 22b, 22f, 23b, 24b, 25b Circulation hole
22d First circulation region
22e Second circulation region
24 First coupling portion
25 Second coupling portion
26 Connection portion

The invention claimed is:

1. A method for manufacturing a mirror device comprising a structure including a base portion and a movable portion supported on the base portion, and a mirror layer provided to the movable portion, the method comprising:
a first step of preparing a wafer having a support layer and a device layer;
a second step of forming a slit in the wafer such that the movable portion becomes movable with respect to the base portion by removing a part of each of the support layer and the device layer from the wafer by etching and forming a plurality of parts each corresponding to the structure in the wafer, after the first step;
a third step of performing wet cleaning for cleaning the wafer using a cleaning liquid after the second step; and
a fourth step of cutting out each of the plurality of parts from the wafer after the third step,
wherein in the second step, a circulation hole penetrating the wafer is formed at a part other than the slit in the wafer by the etching,
wherein in the third step, the wet cleaning is performed such that the cleaning liquid flows through the circulation hole formed in the second step.

2. The method for manufacturing a mirror device according to claim 1,
wherein in the second step, the mirror layer is formed to the wafer at a part corresponding to the movable portion.

3. The method for manufacturing a mirror device according to claim 2, further comprising:
a fifth step of forming a straightening layer on a first front surface where the mirror layer is formed and/or a second front surface on a side opposite to the first front surface of surfaces of the wafer between the third step and the fourth step.

4. The method for manufacturing a mirror device according to claim 1,
wherein in the second step, protective film removal for removing a protective film is performed after a part of the support layer is removed from the wafer, and the plurality of parts are brought to completion after the protective film removal.

5. The method for manufacturing a mirror device according to claim 4,
wherein the protective film is removed by a wet process in the protective film removal.

6. The method for manufacturing a mirror device according to claim 1,
wherein in the second step, patterning member removal for removing a patterning member is performed, and the plurality of parts are brought to completion after the patterning member removal.

7. The method for manufacturing a mirror device according to claim 6,
wherein in the patterning member removal, the patterning member is removed by a wet process.

8. The method for manufacturing a mirror device according to claim 1,
wherein in the second step, a plurality of the circulation holes are formed at a part corresponding to the movable portion.

9. The method for manufacturing a mirror device according to claim 1,
wherein in the second step, the circulation hole is formed at a part corresponding to the base portion.

10. The method for manufacturing a mirror device according to claim 1,
wherein in the second step, the slit is formed such that the movable portion is supported on the base portion by a coupling portion, and the circulation hole is formed at a part corresponding to the coupling portion.

11. The method for manufacturing a mirror device according to claim 1,
wherein in the second step, the circulation hole is formed such that a curved portion is included in at least a part of the circulation hole.

12. The method for manufacturing a mirror device according to claim 1,
wherein in the second step, the circulation hole is formed such that width of the circulation hole vary in a direction perpendicular to the thickness direction when viewed in a thickness direction of the wafer.

13. The method for manufacturing a mirror device according to claim 1,
wherein in the second step, the circulation hole is formed such that edge of the circulation hole on one side and edge on the other side opposite to the edge on the one side exhibit different shapes when viewed in the thickness direction of the wafer.

14. The method for manufacturing a mirror device according to claim 1,
wherein in the second step, the circulation hole is formed such that a connection portion straddling the circulation hole is formed.

15. The method for manufacturing a mirror device according to claim 1,
wherein in the second step, the circulation hole is formed such that the circulation hole communicates with the slit.

16. The method for manufacturing a mirror device according to claim 1, wherein in the second step, the circulation hole is formed at a part corresponding to the movable portion such that the circulation hole includes a first circulation region and a second circulation region adjacent to each other in a direction perpendicular to the thickness direction when viewed in the thickness direction of the wafer.

17. The method for manufacturing a mirror device according to claim 16,
wherein in the second step, the circulation hole is formed such that a connection portion straddling the first circulation region is formed in a direction in which the first circulation region and the second circulation region are arranged when viewed in the thickness direction.

18. The method for manufacturing a mirror device according to claim 16,
wherein in the second step, the circulation hole is formed such that the second circulation region includes a part where a width of the second circulation region in a direction perpendicular to the thickness direction is smaller than a width of the first circulation region in a direction perpendicular to the thickness direction when viewed in the thickness direction.

19. The method for manufacturing a mirror device according to claim 16,
wherein in the second step, the slit is formed such that the movable portion is supported on the base portion by the coupling portion, and the second circulation region is formed such that the second circulation region is adjacent to the coupling portion in a direction in which the first circulation region and the second circulation region are arranged when viewed in the thickness direction.

* * * * *